(12) United States Patent
Cooney, III et al.

(10) Patent No.: US 7,393,777 B2
(45) Date of Patent: Jul. 1, 2008

(54) SACRIFICIAL METAL SPACER DAMASCENE PROCESS

(75) Inventors: Edward C. Cooney, III, Jericho, VT (US); Robert M. Geffken, Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 235 days.

(21) Appl. No.: 10/984,439

(22) Filed: Nov. 9, 2004

(65) Prior Publication Data

US 2005/0085064 A1   Apr. 21, 2005

Related U.S. Application Data

(62) Division of application No. 10/202,134, filed on Jul. 24, 2002, now Pat. No. 6,846,741.

(51) Int. Cl.
*H01L 21/4763* (2006.01)
*H01L 21/311* (2006.01)

(52) U.S. Cl. ..................... 438/637; 438/700
(58) Field of Classification Search ................. 438/624, 438/637–640, 700; 257/751
See application file for complete search history.

(56) References Cited

U.S. PATENT DOCUMENTS

| | | | | |
|---|---|---|---|---|
| 5,126,006 | A * | 6/1992 | Cronin et al. | 438/702 |
| 5,965,679 | A | 10/1999 | Godschalx et al. | |
| 6,017,817 | A | 1/2000 | Chung et al. | |
| 6,140,226 | A * | 10/2000 | Grill et al. | 438/637 |
| 6,187,672 | B1 | 2/2001 | Zhao et al. | |
| 6,235,629 | B1 * | 5/2001 | Takenaka | 438/638 |
| 6,509,267 | B1 * | 1/2003 | Woo et al. | 438/687 |
| 2005/0146040 | A1 * | 7/2005 | Cooney et al. | 257/758 |

OTHER PUBLICATIONS

Semiconductor International; Low K Dielectrics: The Search Continues; Peter Singer; May 1996; pp. 88-96.
International Technology; Post Etch Cleaning of Dual Damascene System Intergrating Copper and Silk TM; Louis et al.; May 1999; pp. 103-105.
Interconnect Technology; Copper-Silk Integration in a 0.18um Double Level Metal Interconnect; Demolliens et al.; May 1999; pp. 198-199.

(Continued)

*Primary Examiner*—Theresa T Doan
(74) *Attorney, Agent, or Firm*—Gibb & Rahman, LLC

(57) ABSTRACT

A method and structure for a dual damascene interconnect structure comprises forming wiring lines in a metallization layer over a substrate, shaping a laminated insulator stack above the metallization layer, patterning a hardmask over the laminated insulator stack, forming troughs in the hardmask, creating sacrificial tungsten sidewall spacers in the troughs, patterning the laminated insulator stack, removing the sacrificial sidewall spacers, forming vias in the patterned laminated insulator stack, and depositing a metal liner and conductive material into the vias and troughs, wherein the laminated insulator stack comprises a dielectric layer further comprising oxide and polyarylene. The step of depositing prevents the laminated insulator stack from sputtering into the vias. Moreover, the step of depositing comprises cleaning the vias and troughs, optionally performing a reactive ion etching or argon sputter cleaning, depositing a plurality of metal layers over the vias and troughs, and depositing copper in the vias and troughs.

20 Claims, 21 Drawing Sheets

OTHER PUBLICATIONS

Interconnect Technology; Etch Process Development for Flare for Dual Damascene Architecture Using a N2/02 Plasma; Thompson et al; May 1999; pp. 59-61.

Microwave Theory and Techniques; Advanced Silicon IC Interconnect Technology and Design: Present Trends and RF Wireless Implications; R.J. Gutmann; Jun. 1999; pp. 667-674.

Interconnect Technology Conference; Lithography as a Critical Step for Low-K Dual Damascene: From 248nm to 193nm; Ronse et al; Jun. 2000; pp. 87-89.

Interconnect Technology; Copper Dual Damascene Integration Using Organic Low K Material: Construction Architecture Comparison; Morand et al; Jun. 2000; pp. 225-227.

Interconnect Technology Conference; Copper Dual Damascene Interconnects With Very Low-K Dielectrics Targeting for 130 nm Node; Kudo et al; Jun. 2000; pp. 270-272.

Interconnect Technology Conference; New Strategy to Improve the Mechanical Strength and to Reduce Potential Contamination of Dielectric Materials for Double Level Metal Integration; Assous et al; Jun. 2000; pp. 90-92.

Interconnect Technology Conference; A High Performance 0.13 um Copper Beol Technology With Low-K Dielectric; Goldblatt et al; Jun. 2000; pp. 261-263.

* cited by examiner

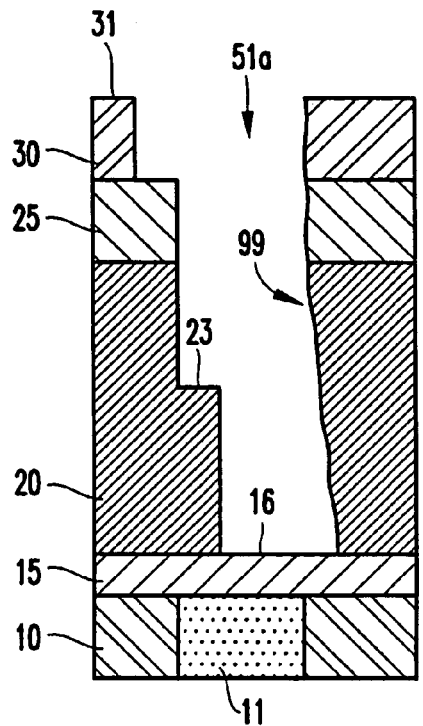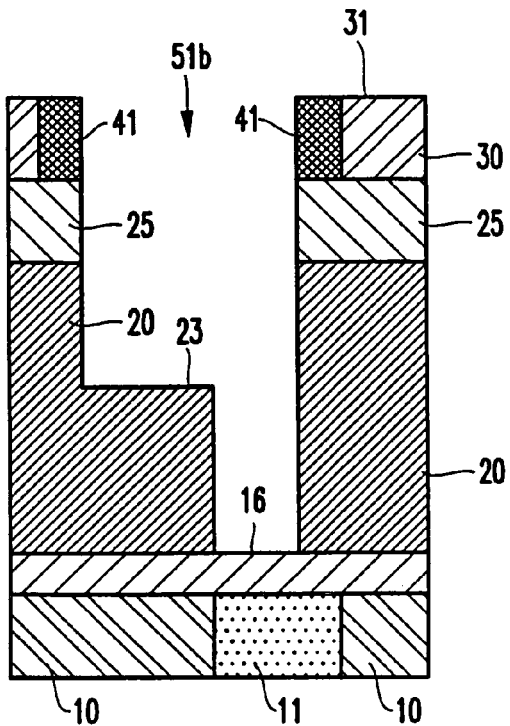
FIG.9A  FIG.9B
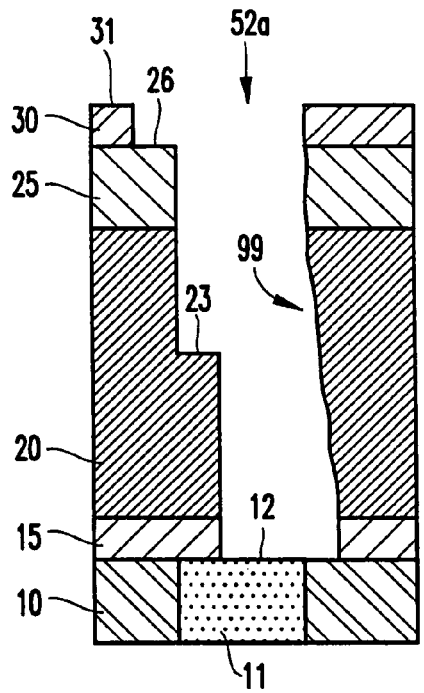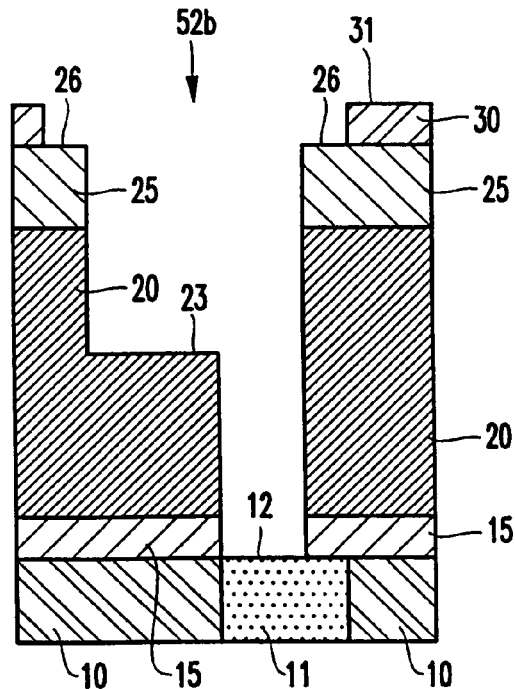
FIG.10A  FIG.10B

SACRIFICIAL METAL SPACER DAMASCENE PROCESS

CROSS-REFERENCE TO RELATED APPLICATIONS

This application is a division of U.S. application Ser. No. 10/202,134 filed Jul. 24, 2002 now U.S. Pat. No. 6,846,741.

BACKGROUND OF THE INVENTION

1. Field of the Invention

The present invention generally relates to integrated circuit design, and more particularly to damascene fabrication using sacrificial metal spacers to aid in the fabrication process.

2. Description of the Related Art

Dual damascene processing in soft, non-silicon containing intermetal dielectrics, such as SiLK®, available from Dow Chemical Company, NY, USA, or FLARE®, available from Honeywell, NJ, USA. (both materials are polyarylenes (PAE)) is extremely difficult at sub 0.25 micron dimensions because of etch bias, undercut corner erosion, etc., and other problems frequent during RIE processing. Additionally, the traditional argon sputter cleans resputtered PAE into the via bottom and onto the underlying metal (i.e. copper or tungsten) surface, resulting in degraded contact interface properties. Although only argon sputtering is given as an example, all methods of directional sputter cleaning, including reactive ion etching (i.e. hydrogen doped) methods are associated with these problems. PAE-type materials are much softer than oxides, and have much lower thermal conductivity, and are not oxygen or water diffusion barriers. Therefore, in general, they have much worse dielectric properties than oxide.

Conventional methods of performing a dual damascene process is through multiple photoresist mask and etch steps. Here, a single level photoresist profile is formed on a layer deposited dielectric and a via pattern is formed by etching to a first interlevel in the dielectric material. At this point in the process the via is only partially etched. The photoresist is then stripped and a second single layer photoresist profile is formed on the dielectric surface to form an interconnect pattern to a second interlevel in the dielectric material. The interconnect is then formed by etching. Coincident with etching the interconnect, the via is etched such that interconnects in underlying substrate layers are exposed to allow electrical contact. However, aligning the photoresist profiles is a problem using this method. For example, if the two photoresist profiles are not aligned correctly, then intersecting features in the dielectric material will be misaligned. That is, a conductive line associated with the first photoresist pattern may not correctly intersect a via associated with the second photoresist profile. These alignment errors can be corrected by making the intersecting features oversized, but this takes away from the overall goal of reducing the size of connecting lines and vias. Thus, alignment problems reduce yields, and increase cost and the complexity of integrated circuit processes.

The trench and via profiles are greatly affected during dual damascene processing, due to the poor etching selectivity between the photoresist and the low dielectric constant dielectrics (low k dielectrics) while oxygen plasma removes the photoresist layer. Moreover, the low k dielectrics fill the gaps between the wiring lines in order to prevent parasitic capacitance, which occurs when the distance between subsequent wiring lines is reduced. Thus, in order to avoid the problems associated with conventional dual damascene manufacturing techniques, complicated processes and structures are implemented.

Even proposed solutions to these rather complex processes, such as the process described in U.S. Pat. No. 6,017,817, issued to Chung, et. al., "Method of Fabricating Dual Damascene," the complete disclosure of which is herein incorporated by reference, does not provide an adequate solution to the problem of eliminating the PAE sputtering into the via bottom. Rather, these processes merely aim to reduce the effective capacitance of the low k dielectrics. In fact, these conventional techniques offer little, if any, solutions to such problems as etch bias and undercut corner erosion in the integrated circuit. Furthermore, the conventional processes do nothing to improve degraded contact interface properties due to the PAE sputtering into the via bottom.

Therefore, there is a need for a new and improved technique of damascene processing which overcomes the limitations of the conventional designs, and which improves the damascene process window, and/or eliminates the PAE sputtering into the via bottom by using a deep etch process.

SUMMARY OF THE INVENTION

In view of the foregoing and other problems, disadvantages, and drawbacks of the conventional dual damascene fabrication techniques the present invention has been devised, and it is an object of the present invention to provide a structure and method for a sacrificial metal spacer damascene (single and dual) fabrication technique. Another object of the present invention is to provide a new and improved technique of dual damascene processing which overcomes the limitations of the conventional designs. Still, another object of the present invention is to improve the dual damascene process window. Yet another object of the present invention is to eliminate the problem of PAE sputtering into the via bottom by using a deep etch process. It is still another object of the present invention to use metal spacers to aid in fabricating damascene wires/vias.

In order to attain the objects suggested above, there is provided, according to one aspect of the invention a dual damascene interconnect structure comprising a substrate, an insulator layer above the substrate, a hardmask over the insulator layer, patterned troughs defined into the hardmask, and patterned vias defined into the insulator layer, wherein the hardmask includes sacrificial sidewall spacers to aid in forming the dual damascene interconnect structure.

According to the present invention, the method of forming a dual damascene interconnect structure in a semiconductor substrate comprises first forming wiring lines in a metallization layer over a substrate. The next step is shaping a laminated insulator stack above the metallization layer. Then, a hardmask is patterned over the laminated insulator stack. After this, troughs are formed in the hardmask. Next, sacrificial sidewall spacers are created in the troughs. Upon completion of this step, the laminated insulator stack is patterned. Then, the sacrificial sidewall spacers are removed. Next, vias are formed in the patterned laminated insulator stack. The next step is depositing a metal liner into the vias and troughs, and finally, conductive material is deposited over the liner, wherein the laminated insulator stack comprises a dielectric layer further comprising oxide and polyarylene. The laminated insulator stack comprises oxide and a dielectric layer further comprising polyarylene. The sacrificial sidewall spacers preferably comprise tungsten. The step of depositing prevents the laminated insulator stack from sputtering into the vias. Moreover, the step of depositing comprises cleaning the vias and troughs, optionally performing a reactive ion etching or argon sputter cleaning, depositing a plurality of metal layers over the vias and troughs, and depositing copper in the vias and troughs.

Alternatively, the method comprises first forming a trough mask pattern into a hardmask layer over a substrate. Then, a via mask pattern is patterned into an insulator layer, wherein the insulator layer is below the hardmask layer. Next, sidewall spacers are selectively etched in the hardmask layer. After this, troughs are created, which are defined by the trough mask pattern. Then, the sidewall spacers are removed, and finally, vias are created, which are defined by the via mask pattern. Still alternatively, the process of first etching the troughs and then etching the vias can be reversed, wherein the vias are etched prior to the troughs.

There are several benefits of the present invention. For example, the present invention provides a novel structure and method for forming a sacrificial metal spacer dual damascene structure as well as a single damascene structure. Also, the present invention provides a new and improved technique of dual damascene and single damascene processing which overcomes the limitations of the conventional designs. Additionally, the present invention improves the dual damascene process window. Furthermore, the present invention eliminates the problem of PAE sputtering into the via bottom by using a deep etch process. Finally, the present invention uses metal (tungsten) spacers to aid in fabricating damascene wires/vias.

BRIEF DESCRIPTION OF THE DRAWINGS

The foregoing and other objects, aspects and advantages will be better understood from the following detailed description of the preferred embodiments of the invention with reference to the drawings, in which:

FIGS. 9A and 9B are schematic diagrams of partially completed integrated circuits according to the present invention;

FIGS. 10A and 10B are schematic diagrams of partially completed integrated circuits according to the present invention;

DETAILED DESCRIPTION OF PREFERRED EMBODIMENTS OF THE INVENTION

Figure 1A:
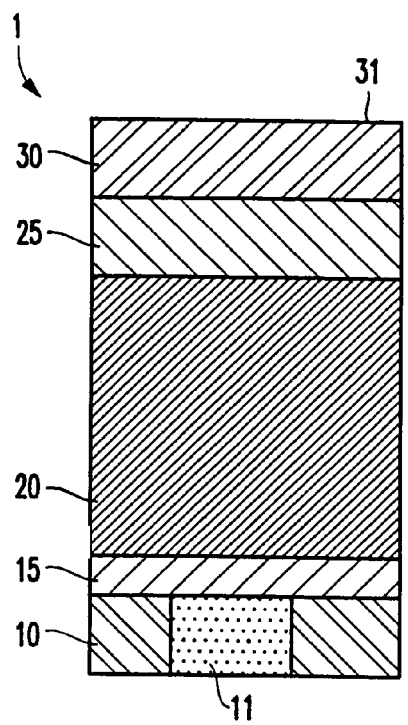
FIGS. 1A and 1B are schematic diagrams of partially completed integrated circuits according to the present invention.
Figure 1B:
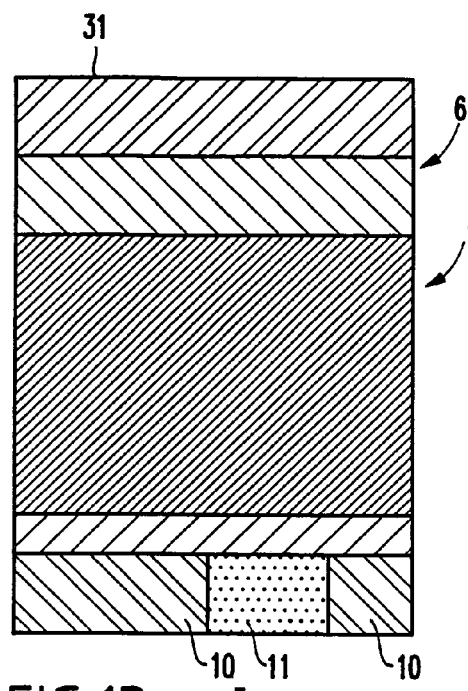

As mentioned there is a need for a new and improved technique of dual damascene processing which overcomes the limitations of the conventional designs, and which improves the dual damascene process window, and/or eliminates the PAE sputtering into the via bottom by using a deep etch process. Therefore, according to the present invention metal spacers are used to aid in fabricating damascene wires/vias. Referring now to the drawings, and more particularly to FIGS. 1A-33, there are shown preferred embodiments of the method and structures according to the present invention.

In a first embodiment shown in FIGS. 1A-12B metal spacers are applied along the sidewalls of a low-k dielectric layer, such as SiLK®. In this trough first, via second dual damascene integration scheme, the troughs are defined into a hardmask, the vias are defined and etched into the SiLK®, and the trough hardmask pattern is used as a mask to etch the troughs into the SiLK®. The metal spacer, which is preferably tungsten, but may comprise other materials, such as tantalum nitride, adds a systematic trim to the trough opening which increases the lithographic process window.

FIGS. 1A, 2A, 3A, 4A, 5A, 6A, 7A, 8A, 9A, 10A, 11A, and 12A illustrate processing without the inventive spacers 41, while FIGS. 1B, 2B, 3B, 4B, 5B, 6B, 7B, 8B, 9B, 10B, 11B, and 12B illustrate the advantages produced by the spacers. The following discussion explains both series of "A" and "B" Figures similarly, except where differences exist. FIG. 1 shows a first embodiment of the present invention, and more specifically, a partially completed integrated circuit device 1 comprising a plurality of insulator layers 7 stacked on a substrate 5. Next, a metallization layer 10 is deposited over the substrate 5. The metallization layer 10 comprises wiring conductors 11 therein. The wiring conductors are preferably comprised of copper. Above the metallization layer 10 and wiring conductors 11 is a first nitride insulating barrier layer 15. Above the first nitride layer 15 is a layer 20 of low dielectric constant material, such as SiLK®, FLARE®, and traditional materials such as silicon dioxide, fluorinated silicon dioxide (FSG), and microporous glasses such as Nanoglass®, available from Honeywell, Inc., NJ, USA, as well as Black Diamond, available from Applied Material, CA, USA; Coral, available from Novellus Systems, Inc., CA, USA; and Xerogel, available from Allied Signal, NJ, USA. Next, above the low-k layer 20 is a second nitride insulating barrier layer 25. Finally, a cap insulating oxide layer 30 having an upper surface 31 is shown above the second nitride layer 25. The oxide layer 30 and the second nitride layer 25 together comprise a hardmask 6.

Figure 2A:
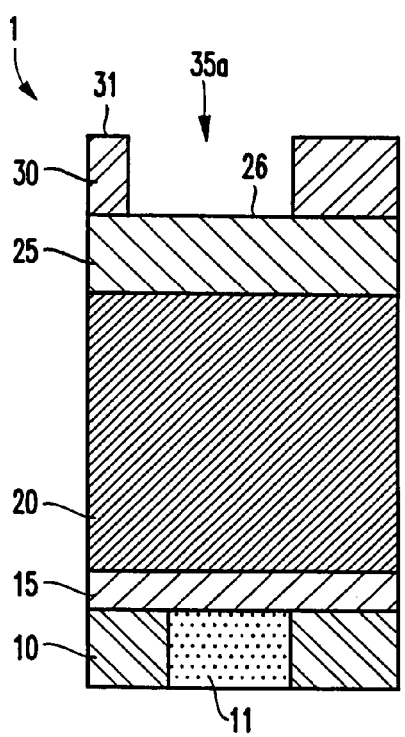
FIGS. 2A and 2B are schematic diagrams of partially completed integrated circuits according to the present invention.
Figure 2B:
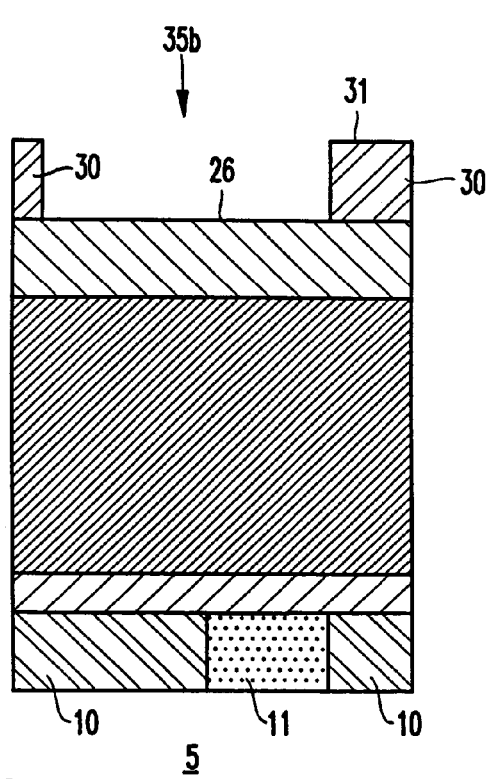
Figure 3A:
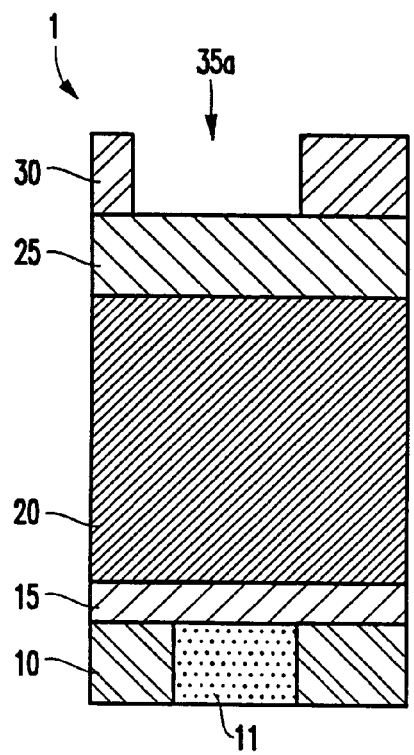
FIGS. 3A and 3B are schematic diagrams of partially completed integrated circuits according to the present invention.
Figure 3B:
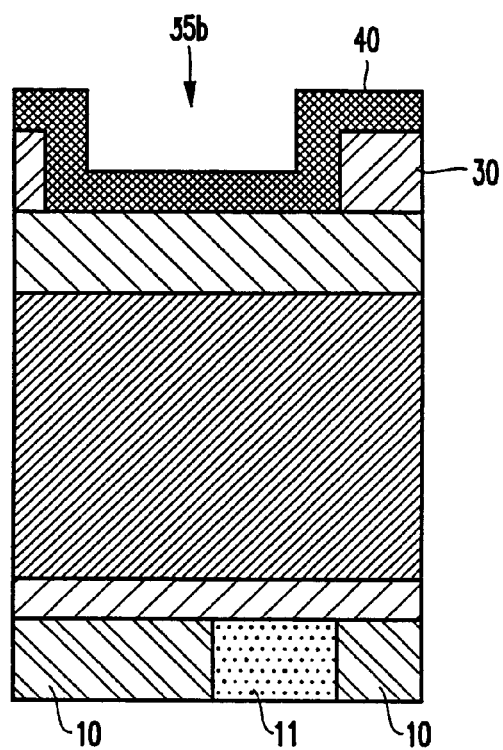

FIGS. 2A and 2B show the partially completed integrated circuit device 1 in the next phase of processing. Here, the upper cap oxide layer 30 is patterned using conventional processing techniques, which are well known in the art, thereby forming troughs 35a, 35b. The patterning process exposes the upper surfaces 26 of the second nitride layer 25. In FIG. 3B, it is illustrated that a conductive layer 40, preferably tungsten, is deposited uniformly above the oxide layer 30 and into the troughs 35a, 35b. In FIG. 3A this layer is not deposited.

Figure 4A:
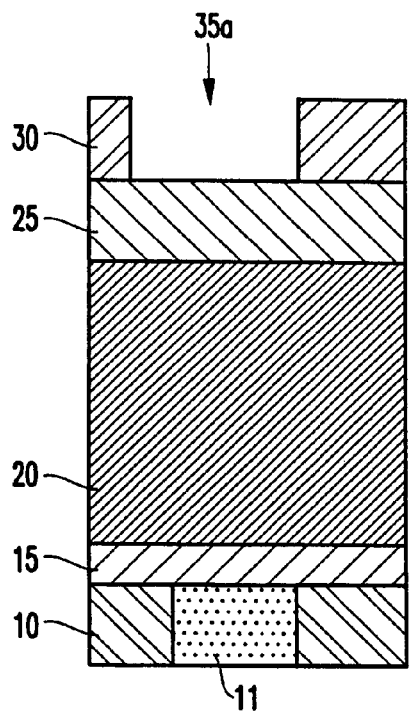
FIGS. 4A and 4B are schematic diagrams of partially completed integrated circuits according to the present invention.
Figure 4B:
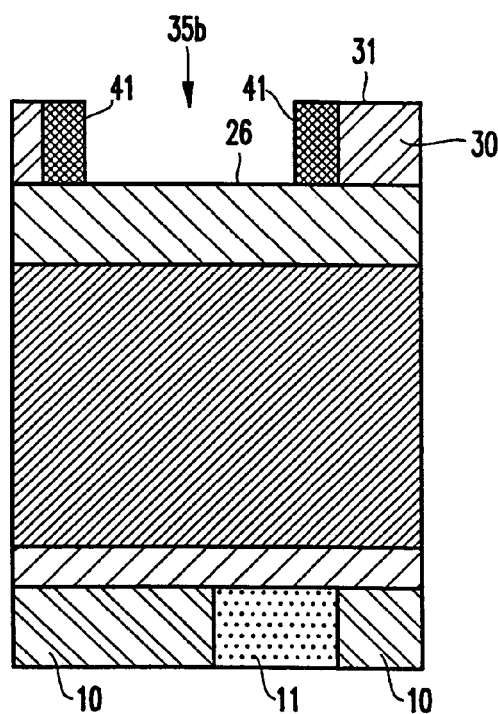

Next, as best seen in FIG. 4B, the conductive layer 40 is selectively etched thereby resulting in etched sidewall spacers 41 adjacent to the sidewalls of the oxide surfaces 30 in the troughs 35a, 35b. The spacers are not formed in FIG. 4A. Here, the etching results in exposing portions of the upper surface 26 of the second nitride layer 25, and portions of the upper surface 31 of the upper cap oxide layer 30. The trough 35b in FIG. 4B (and subsequent "B" drawings) represents the optimized design situation, whereas the trough 35a in FIG. 4A (and subsequent "A" drawings) represents an inferior device formation situation.

Figure 5A:
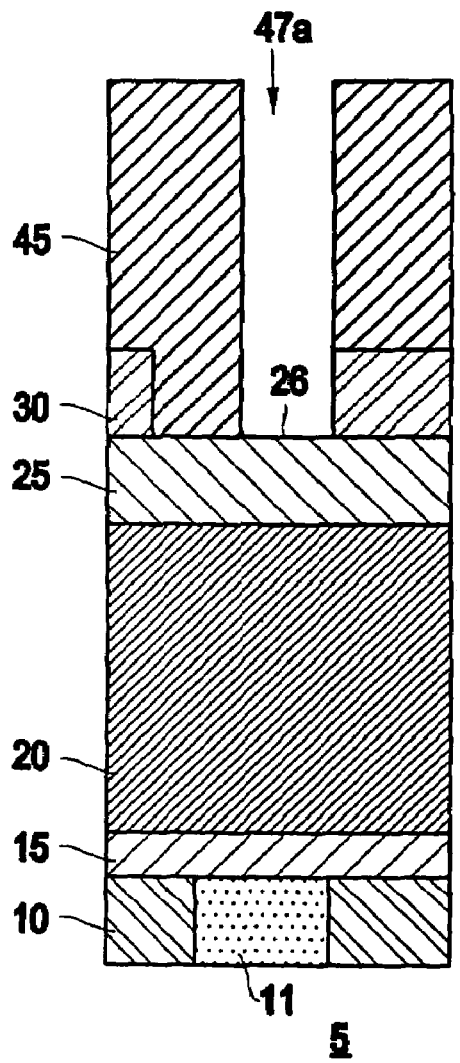
FIGS. 5A and 5B are schematic diagrams of partially completed integrated circuits according to the present invention.
Figure 5B:
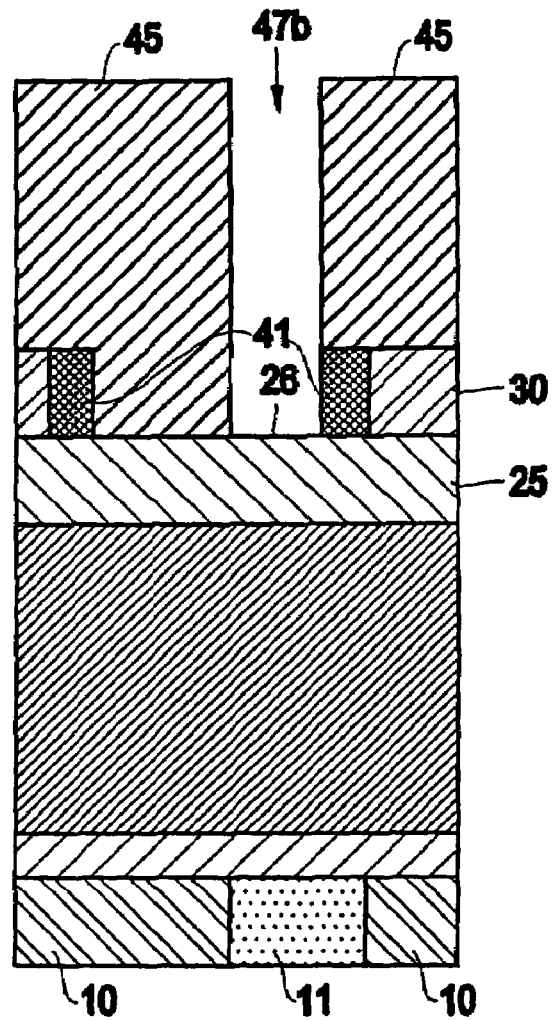

FIGS. 5A and 5B illustrate the integrated circuit device 1 in its next phase of processing, wherein a via photoresist layer 45 is selectively etched over the oxide layer 30 and the sidewall spacers 41. Patterned vias 47a, 47b remain after the etching is complete. Vias 47a, 47b expose a portion of the upper surface 26 of the second nitride layer 25. Moreover, in FIG. 5A via 47a (unoptimized design) the subsequent traditional argon sputter cleaning processes resputter PAE into the via 47a bottom and onto the underlying metal (i.e. copper or tungsten) surface 21, resulting in degraded contact interface properties. Thus, with the optimized situation shown in FIG. 5B vias 47b, according to the present invention, the sidewall spacers 41 protect the via 47b bottoms and resulting in better contact interface properties than the unoptimized situation.

Figure 6A:
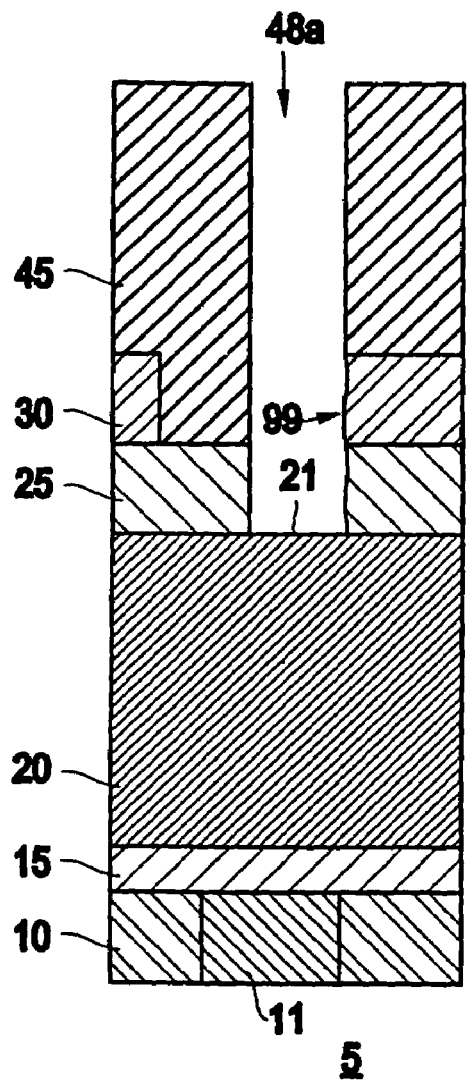
FIGS. 6A and 6B are schematic diagrams of partially completed integrated circuits according to the present invention.
Figure 6B:
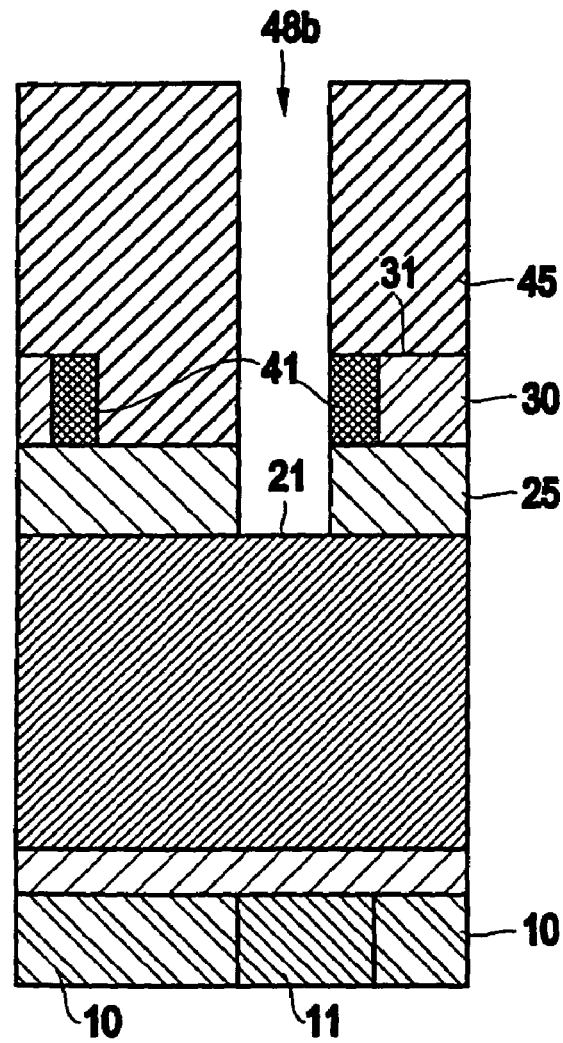

Next, as shown in FIGS. 6A and 6B, the via photoresist layer 45 is further etched and vias 48a, 48b are formed. That is, the patterning occurs in patterned vias 47a, 47b, and here the exposed portions of the upper surface 26 of the second nitride layer 25 and one of the sidewall spacers 41 in via 47a are etched, thereby resulting in a patterned vias 48a, 48b (vias 47a, 47b become vias 48a,b, 49a,b, 50a,b, 51a,b, and 52a,b, respectively, in the subsequent patterning processes to follow). Patterned vias 48a, 48b expose a portion of the upper surface 21 of the layer 20 of low dielectric constant material.

Some of the problems, generally indicated by the arrow 99 in FIG. 6A (and the remaining "A" drawings) which will occur on the unoptimized (left) side include RIE etch bias, undercut of the etched structure, and corner erosion during or after RIE processing due to misalignment of the vias to troughs. This is a result of not having the sidewall spacers 41. Thus, according to the present invention as illustrated by the optimized solution ("B" drawings), whereby the sidewall spacers 41 protect the underlying structure, the above-identified problems are remedied.

Figure 7A:
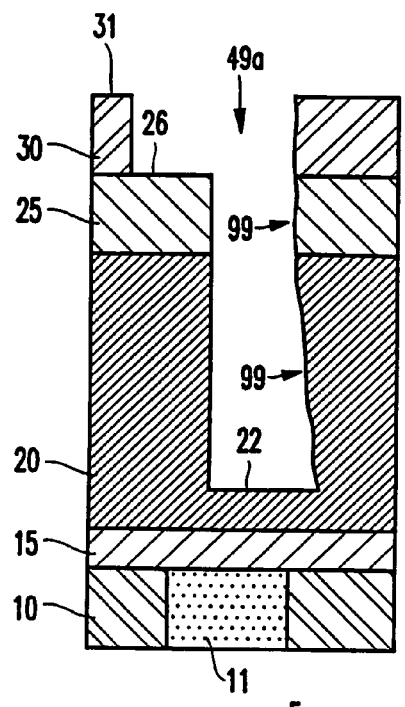
FIGS. 7A and 7B are schematic diagrams of partially completed integrated circuits according to the present invention.
Figure 7B:
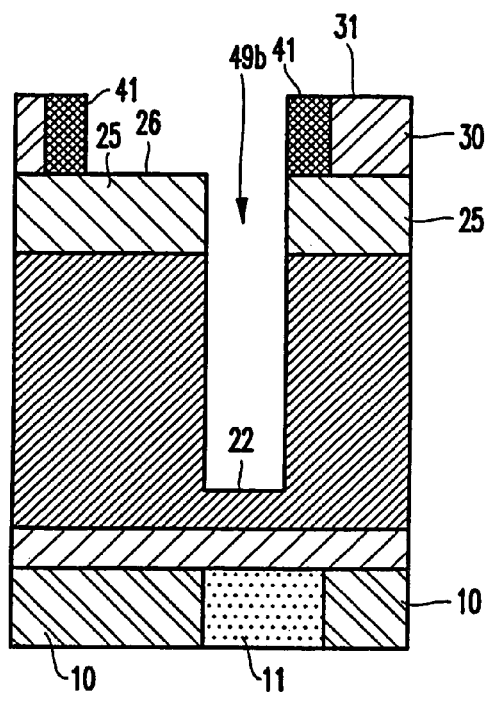
Figure 8A:
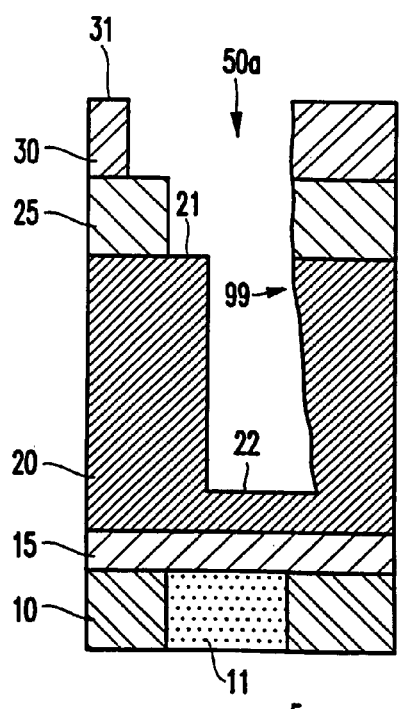
FIGS. 8A and 8B are schematic diagrams of partially completed integrated circuits according to the present invention.
Figure 8B:
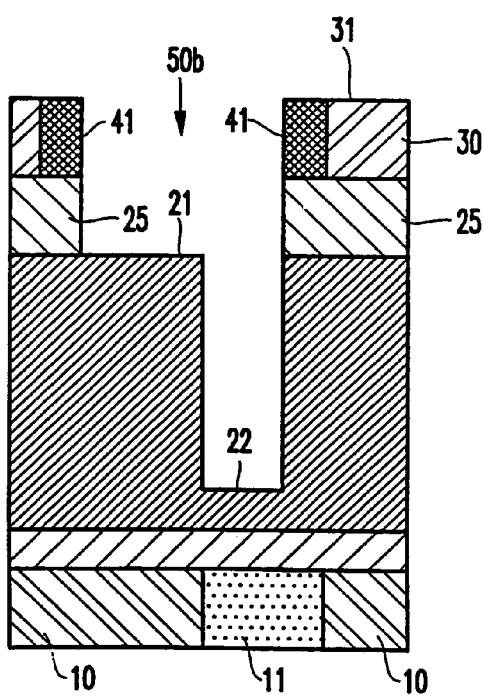

In FIGS. 7A and 7B, a further patterning process occurs, whereby vias 48a, 48b are further etched into the layer 20 of the low dielectric constant material, thereby creating vias 49a, 49b and with trench surfaces 22 in the low-k layer 20. Also, the via photoresist layer 45 is removed, and the upper surface 31 of the oxide layer 30 is exposed, as well as portions 26 of the second nitride layer 25, portions of the low dielectric constant material layer 20, and the sidewall spacers 41. Next, in FIGS. 8A and 8B the device 1 undergoes an additional patterning step, wherein vias 50a, 50b are created by removing the exposed portions of the upper surface 26 of the second nitride layer 25. This patterning step results in additional exposed surfaces 21 of the low dielectric constant material layer 20.

FIGS. 9A and 9B illustrate the next step of the process of forming the integrated circuit device 1. Here, the device 1 is further patterned by removing additional portions of the low-k layer 20, thereby creating vias 51a, 51b. Moreover, the patterning results in exposing a lower level of the upper surface 23 of the low-k layer 20, and also, the upper surface 16 of the first nitride layer 15 is exposed in the patterned regions 51a, 51b.

Figure 11A:
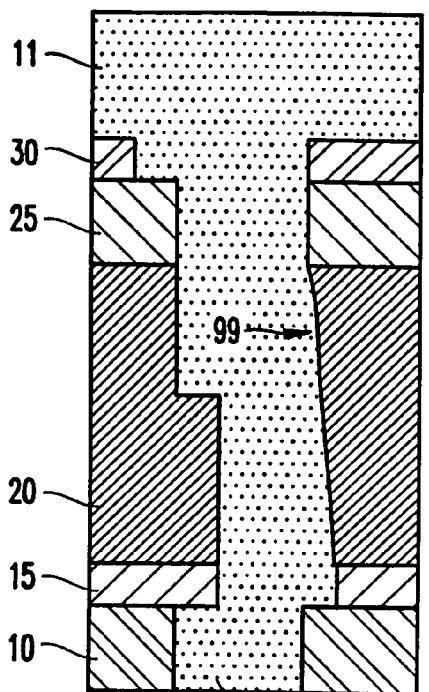
FIGS. 11A and 11B are schematic diagrams of partially completed integrated circuits according to the present invention.
Figure 11B:
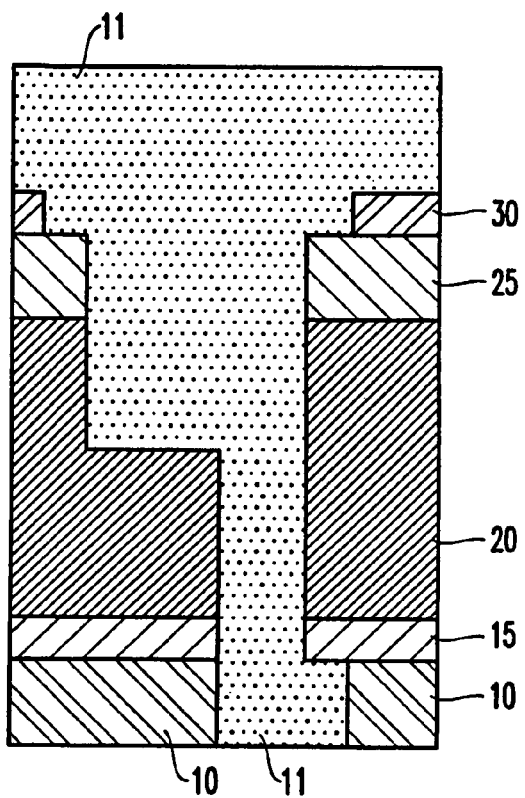

In FIGS. 10A and 10B, the device 1 undergoes further patterning, wherein vias 52a, 52b are created by removing the sidewall spacers 41, and further etching the first nitride layer 15 to expose the upper surface 12 of the wiring conductors 11 in the vias 52a, 52b. Next, as shown in FIGS. 11A and 11B, the vias 52a, 52b are filled with a metal material, preferably copper, to create conductors 11, which comprises the same material as used to create the wiring conductors 11. Moreover, the metal material is deposited over the entire device 1 to create a temporary conductive cap layer 11. Not shown in FIGS. 11A and 11B is an intermediate "liner" material that may be deposited prior to the copper fill material. This would preferably be a thin liner on the top surfaces of the "open" structure and into which the copper fill material would be placed. Preferably, the liner is comprised of tantalum, tantalum-nitride, tungsten, and CVD titanium nitride, as well as other suitable materials.

Figure 12A:
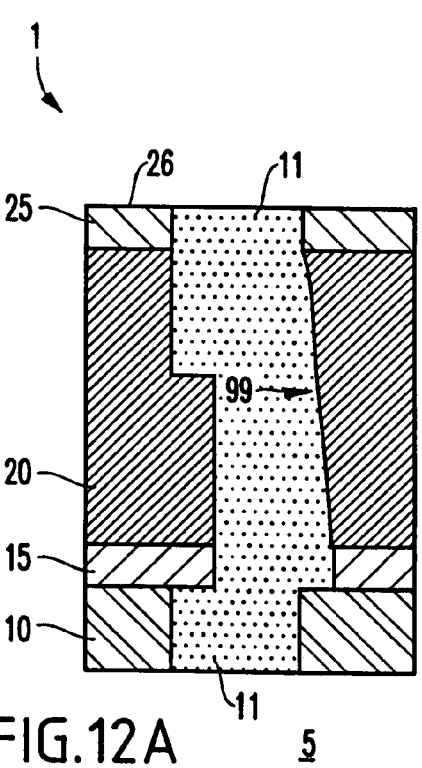
FIGS. 12A and 12B are schematic diagrams of completed integrated circuits according to the present invention.
Figure 12B:
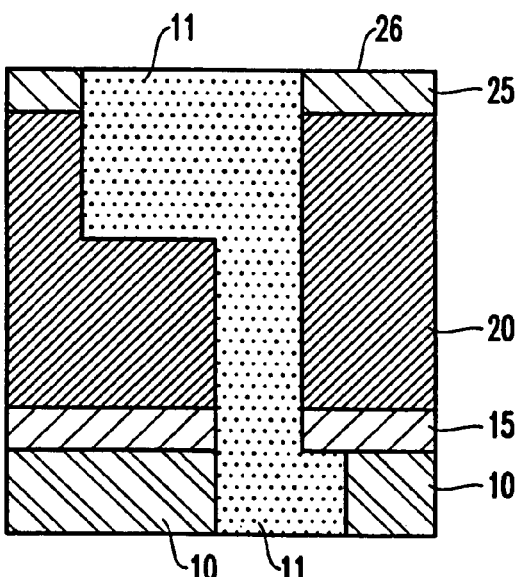

FIGS. 12A and 12B illustrate the final step in the process wherein the device 1 is planarized, thus removing the oxide layer 30 and the portion of the upper temporary conductive cap layer 11 above the second nitride layer 25. The completed planarized device 1 comprises the metallization layer 10 over the substrate 5. The metallization layer 10 comprises wiring conductors 11 therein. Above the metallization layer 10 and wiring conductors 11 is the first nitride insulating barrier layer 15. Above the first nitride layer 15 is the layer 20 of low dielectric constant material, such as SiLK®, FLARE®, and traditional materials such as silicon dioxide and fluorinated silicon dioxide (FSG), and microporous glasses such as Nanoglass®, as well as Black Diamond, Coral, and Xerogel. Next, above the low-k layer 20 is the second nitride insulating barrier layer 25. The conductors 11 extend through the low-k layer 20 up through the upper surface 26 of the device 1.

One of the benefits of the first embodiment is that the spacers allow an improved photolithography process window because issues such as RIE etch bias, undercut of the etched structure during RIE processing, corner erosion either during or after RIE processing including during liner/seedlayer deposition, etc. (99), are eliminated, or, at the very least, are reduced. Also, the overall ability to resolve and etch open and consistent structures in polyarlyenes is provided. Additionally, by adding the tungsten spacers, according to the present invention, the functionability of the device improves because the spacers protect the sidewalls of the structure during RIE etching and inhibit the above problems from occurring.

A second embodiment is shown in FIGS. 13 through 26. This embodiment illustrates the structure and method of fabricating dual damascene troughs/vias into an oxide/PAE stack. The advantage of using a dual oxide/PAE stack is that the oxide can provide mechanical support to the wires fabricated in PAE, the oxide acts as an oxygen/water diffusion barrier, and also the oxide is a very efficient thermal conductor. Additionally, the adhesion of the metallized via bottom to the underlying metal is improved by fabricating it in oxide rather than in PAE.

Figure 13:
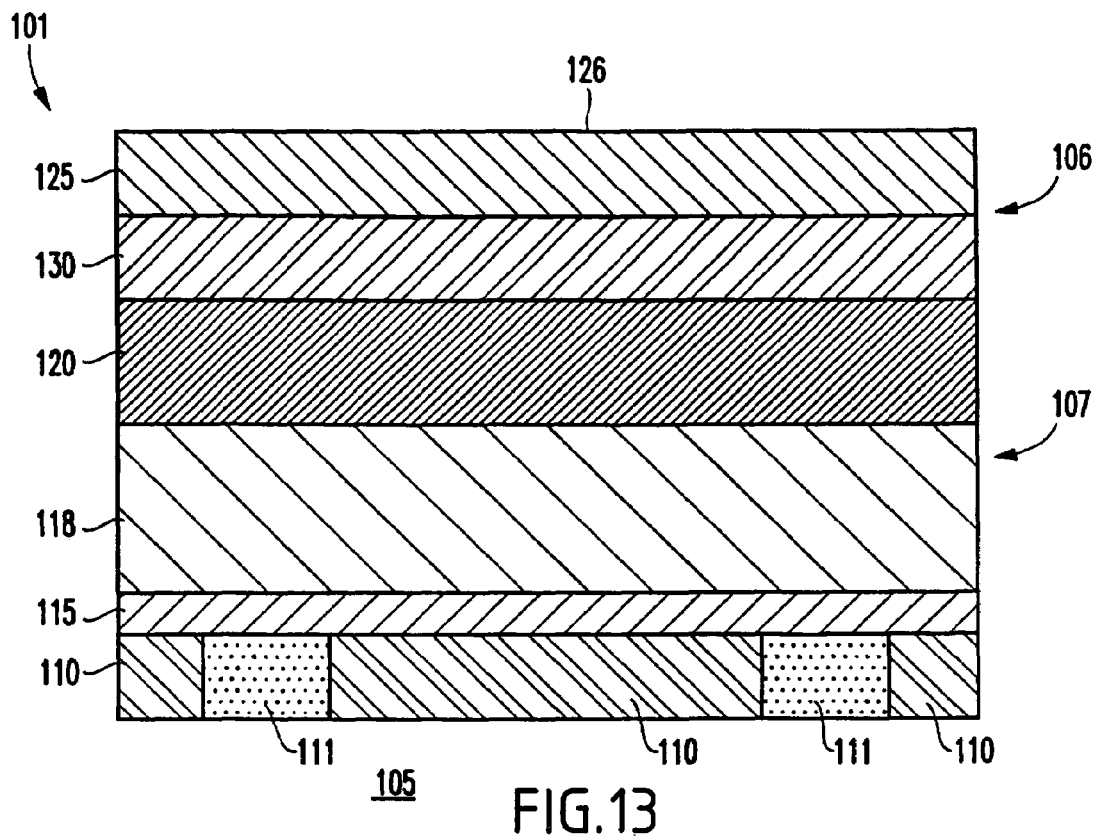
FIG. 13 is a schematic diagram of a second embodiment of a partially completed integrated circuit according to the present invention.

FIG. 13 shows a partially completed integrated circuit device 101 comprising a plurality of insulator layers 107 stacked on a substrate 105. A metallization layer 110 is deposited over the substrate 105. The metallization layer 110 comprises wiring conductors 111 therein. Above the metallization layer 110 and wiring conductors 111 is a first nitride insulating barrier layer 115. Above the first nitride layer 115 is an insulating oxide layer 118, and above the oxide layer 118 is a layer 120 of low dielectric constant material, such as SILK®, FLARE®, and traditional materials such as silicon dioxide, fluorinated silicon dioxide (FSG), and microporous glasses such as Nanoglass®, as well as Black Diamond, Coral, and Xerogel. Next, above the low-k layer 120 is a second insulating oxide layer 130. Finally, above the second oxide layer 130 is a second nitride insulating barrier layer 125 having an upper surface 126. The second oxide layer 30 and the second nitride layer 25 together comprise a hardmask 106.

Figure 14:
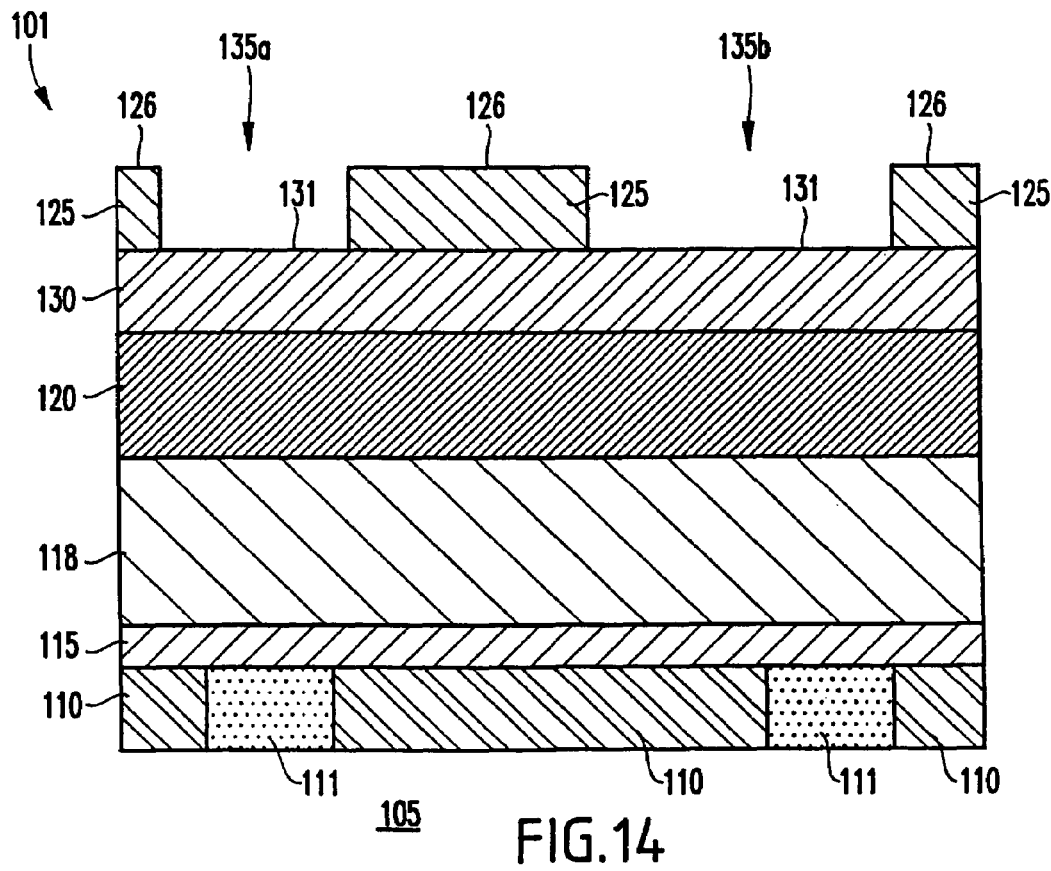
FIG. 14 is a schematic diagram of a second embodiment of a partially completed integrated circuit according to the present invention.

FIG. 14 shows the partially completed integrated circuit device 101 in the next phase of processing. Here, the second nitride layer 125 is patterned using conventional processing techniques, which are well known in the art, thereby forming troughs 135a, 135b. The trough 135b on the right hand side of the drawings (and subsequent drawings) represents the optimized design situation, whereas the trough 135a on the left hand side of the drawings (and subsequent drawings) represents the unoptimized design situation. The patterning process exposes the upper surfaces 131 of the second oxide layer 130.

Figure 15:
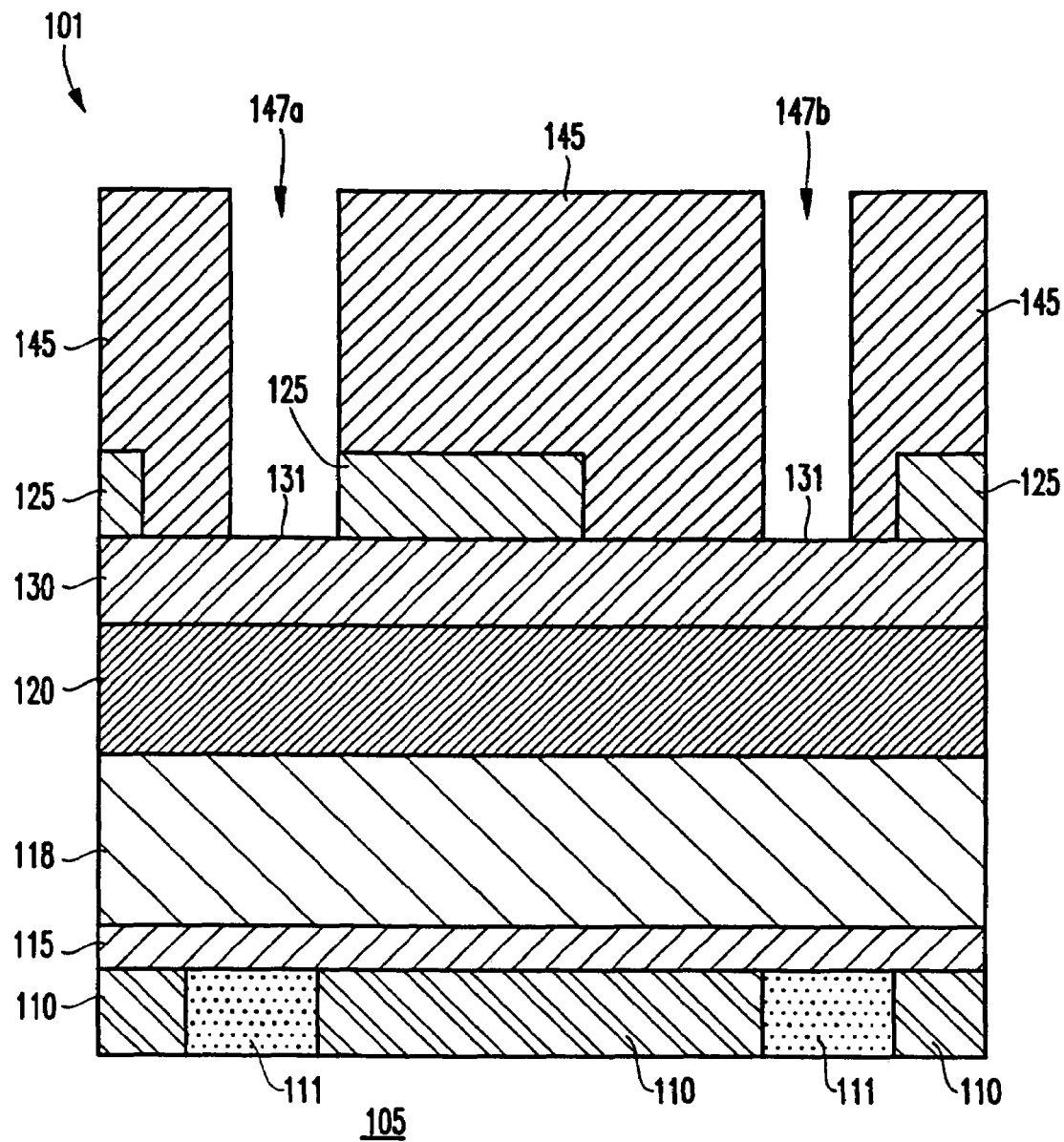
FIG. 15 is a schematic diagram of a second embodiment of a partially completed integrated circuit according to the present invention.

Next, in FIG. 15 the integrated circuit device 101 undergoes its next phase of processing, wherein a via photoresist layer 145 is selectively etched over the second nitride layer 125 and portions of the second oxide layer 130. Vias 147a, 147b remain after the etching is complete. Moreover, vias 147a, 147b expose a portion of the upper surface 131 of the second oxide layer 130. Also, in the left hand side via 147a (unoptimized design) a portion of a side of the second nitride layer 125 is also exposed after the patterning. In this unoptimized design, 147a, the subsequent traditional argon sputter cleaning processes resputter PAE into the via 147a bottom and onto the underlying metal (i.e. copper or tungsten) surface 112, resulting in degraded contact interface properties. Thus, with the optimized situation shown in vias 147b, according to the present invention, the second nitride layer 125 is completely protected by the via photoresist layer 145, thereby protecting the via 147b bottoms and resulting in better contact interface properties than the unoptimized situation.

Figure 16:
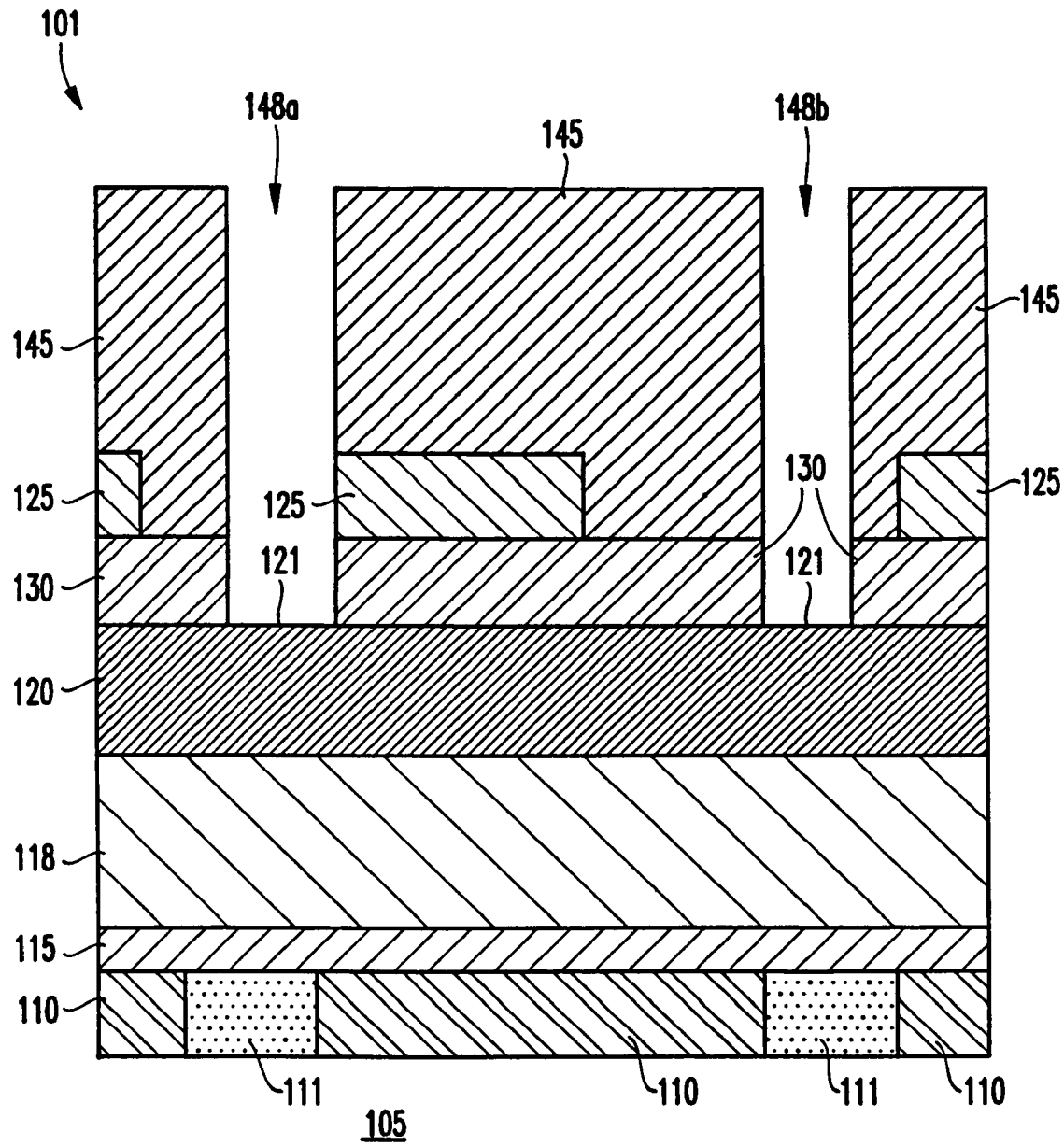
FIG. 16 is a schematic diagram of a second embodiment of a partially completed integrated circuit according to the present invention.

Next, as shown in FIG. 16, the via photoresist layer 145 is further etched and patterned vias 148a, 148b are formed. That is, the patterning occurs in patterned vias 147a, 147b, and here the exposed portions of the upper surface 131 of the second oxide layer 130 are patterned, thereby resulting in patterned vias 148a, 148b (vias 147a, 147b become vias 148a,b, 149a,b, 150a,b, 151a,b, 152a,b, 153a,b, 154a,b, 155a,b, and 156a,b, respectively, in the subsequent patterning processes to follow). Patterned vias 147b expose a portion of the upper surface 121 of the layer 120 of low dielectric constant material.

Figure 17:
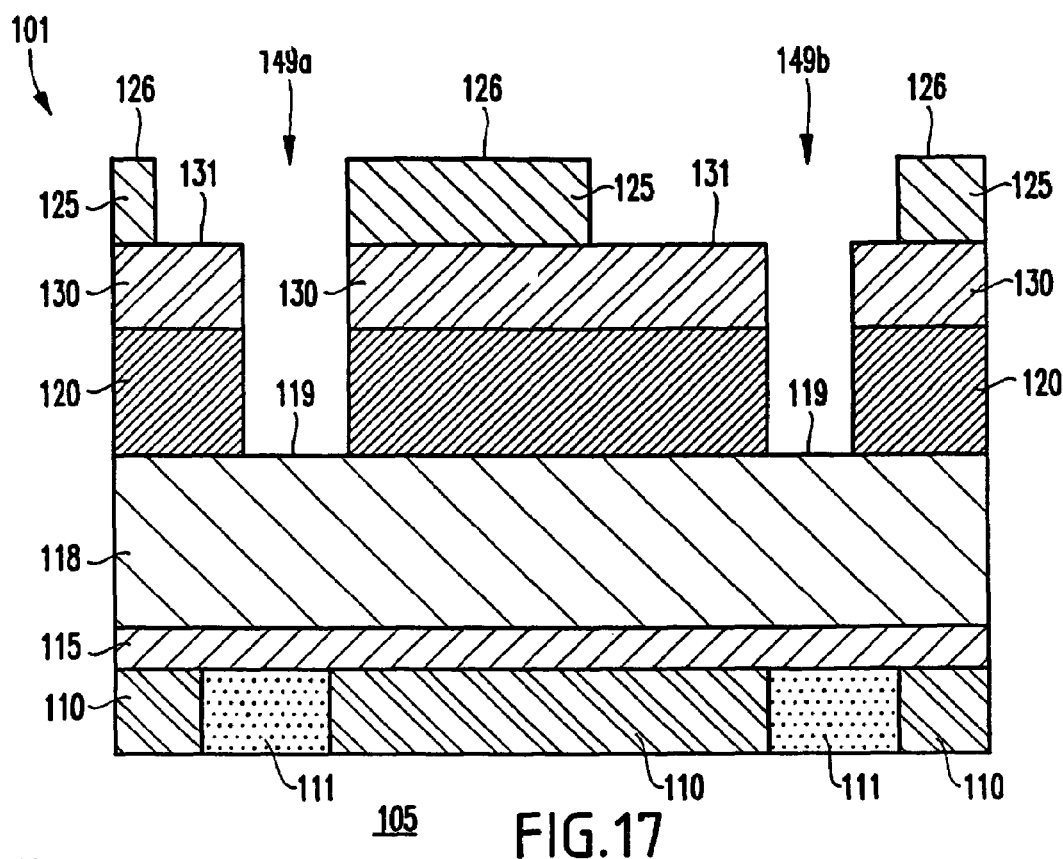
FIG. 17 is a schematic diagram of a second embodiment of a partially completed integrated circuit according to the present invention.

In FIG. 17, a further patterning process occurs, whereby patterned vias 148a, 148b are further etched into the layer 120 of the low dielectric constant material, thereby creating vias 149a, 149b. Also, the via photoresist layer 145 is removed, and the upper surface 126 of the second nitride layer 125 is exposed, as well as portions 131 of the second oxide layer 130, and the upper surface 119 of the first oxide layer 118.

Figure 18:
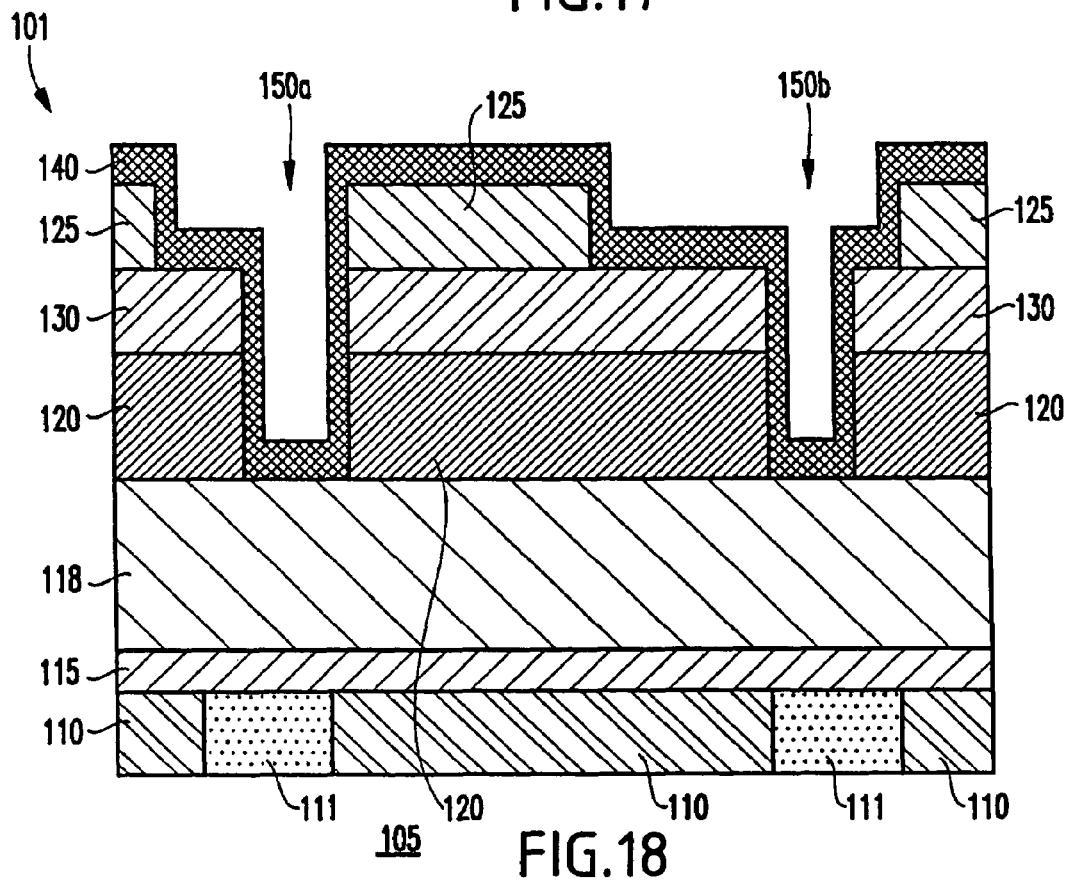
FIG. 18 is a schematic diagram of a second embodiment of a partially completed integrated circuit according to the present invention.
Figure 19:
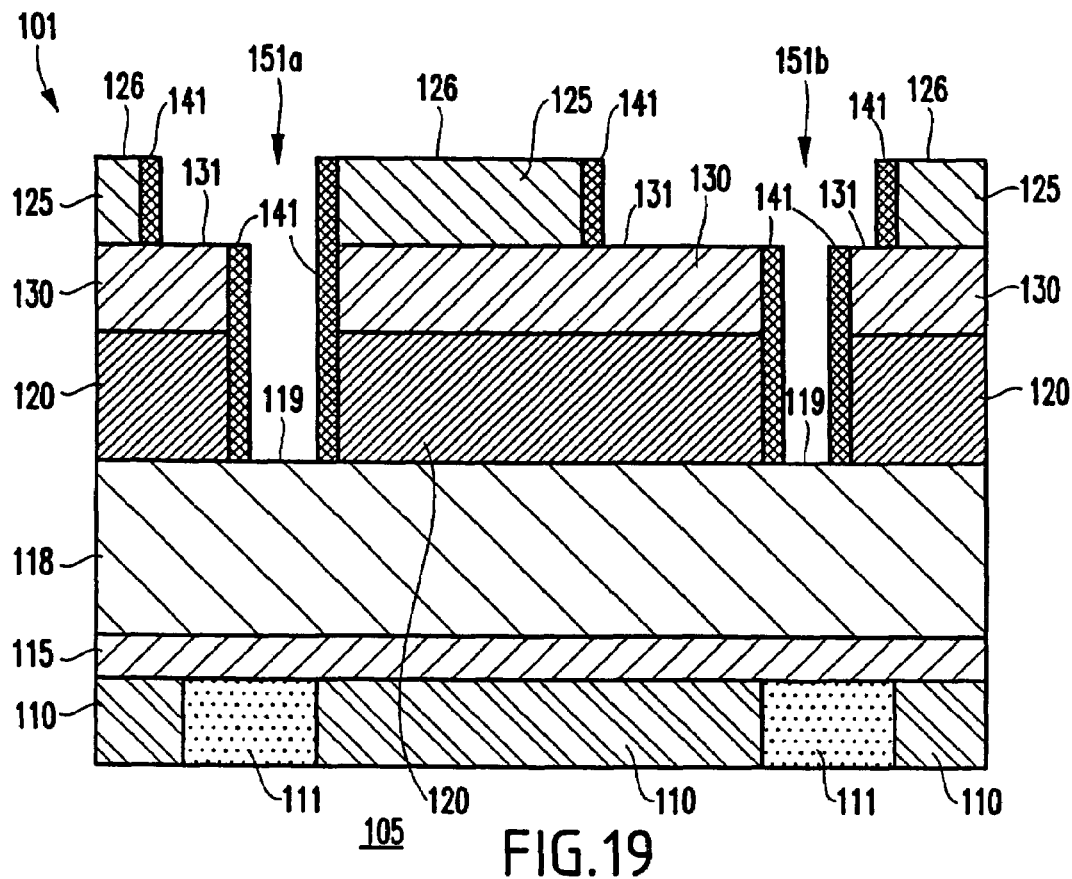
FIG. 19 is a schematic diagram of a second embodiment of a partially completed integrated circuit according to the present invention.

In FIG. 18, it is illustrated that a conductive layer 140, preferably tungsten, is deposited uniformly above the second nitride layer 125 and into vias 150a, 150b. The conductive layer 140 extends over portions of the second oxide layer 130 and the first oxide layer 118. Next, as best seen in FIG. 19, the conductive layer 140 is selectively etched thereby resulting in vias 151a, 151b and etched sidewall spacers 141 adjacent to the sidewalls of the second nitride layer surfaces 125, the second oxide layer surfaces 130, and the low-k layer surfaces 120. Here, the etching results in exposing portions of the upper surface 119 of the first oxide layer 118, the upper surface 131 of the second oxide layer 130, and the upper surface 126 of the second nitride layer 125.

Figure 20:
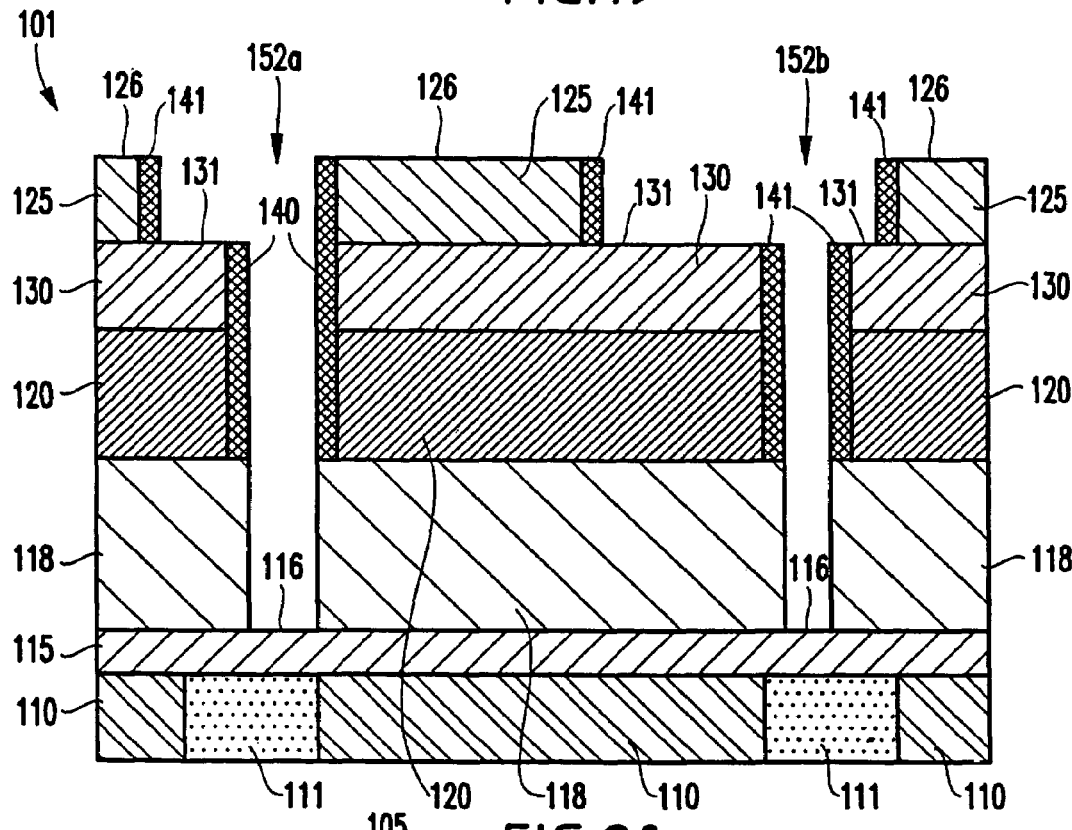
FIG. 20 is a schematic diagram of a second embodiment of a partially completed integrated circuit according to the present invention.
Figure 21:
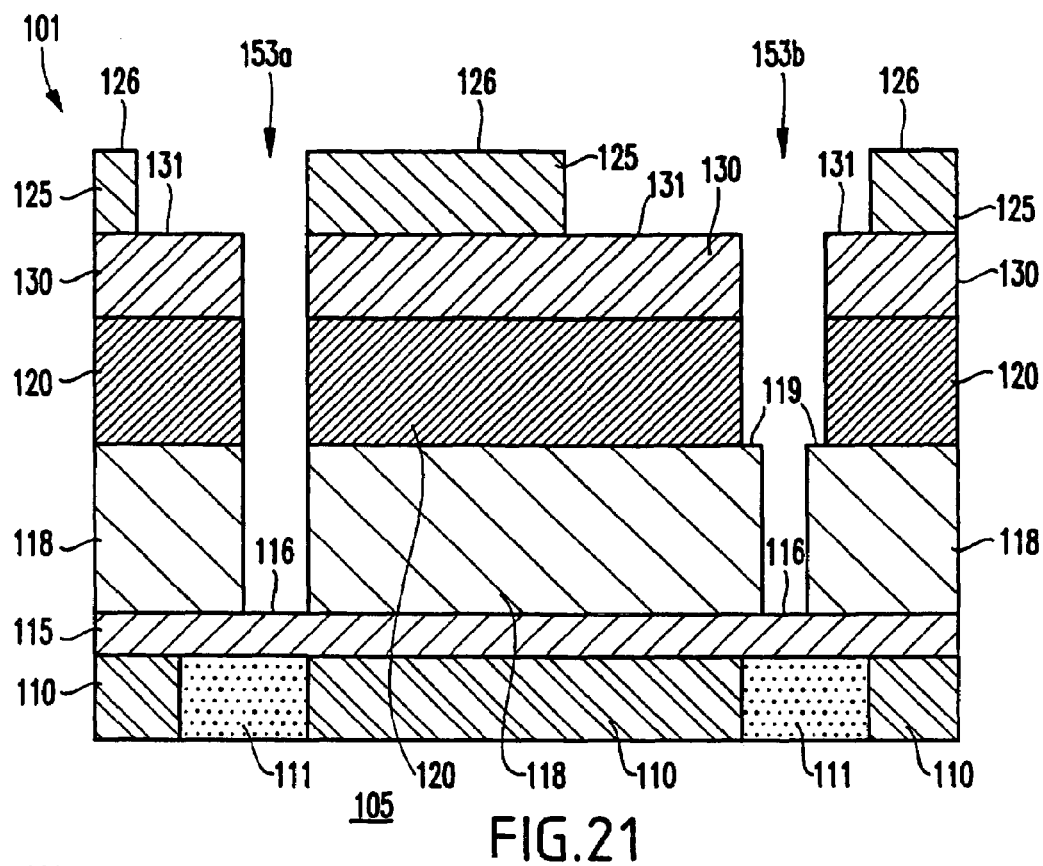
FIG. 21 is a schematic diagram of a second embodiment of a partially completed integrated circuit according to the present invention.
Figure 22:
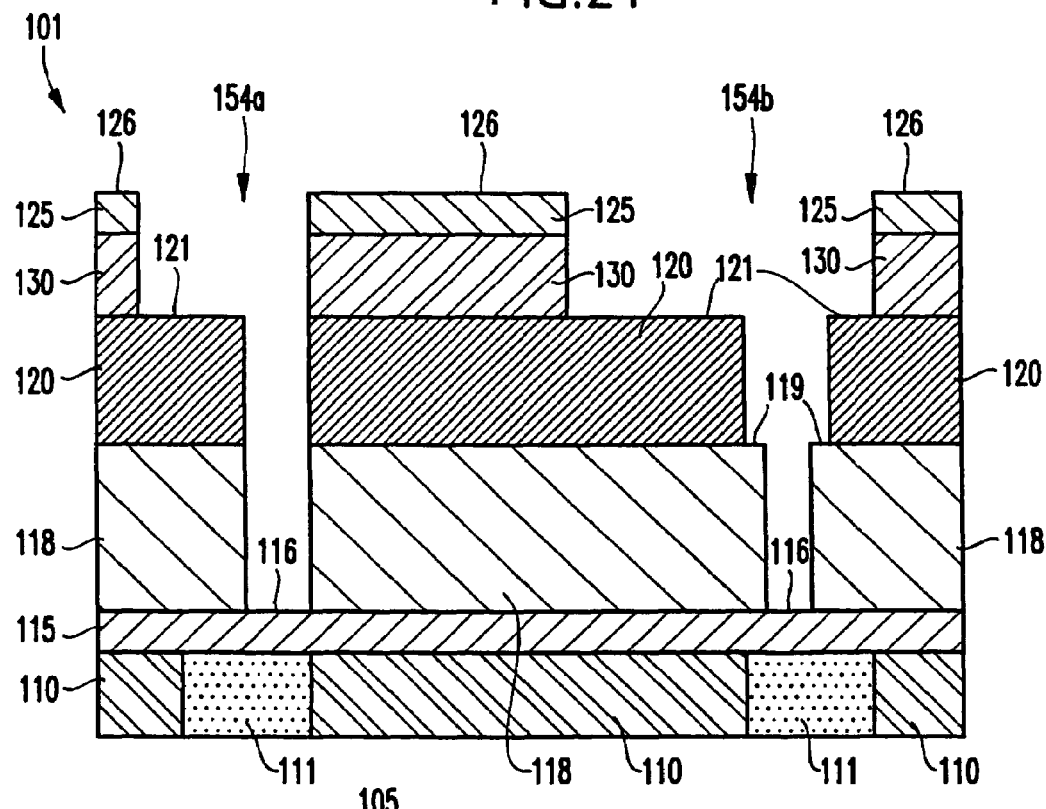
FIG. 22 is a schematic diagram of a second embodiment of a partially completed integrated circuit according to the present invention.

Next, in FIG. 20 the device 101 undergoes an additional patterning step, wherein vias 152a, 152b are created by removing the exposed portions 119 of the first oxide layer 118. This patterning step results in additional exposed surfaces 116 of the first nitride layer 115. FIG. 21 illustrates the next step of the process of forming the integrated circuit device 101. Here, the device 101 undergoes further patterning, wherein patterned vias 153a, 153b are created by removing the sidewall spacers 141. In FIG. 22, the device 101 is further patterned by removing additional portions of the second oxide layer 130, thereby creating vias 154a, 154b. Moreover, the patterning results in exposing the upper surface 121 of the low-k layer 120. Also, portions of the upper surface 119 of the first oxide layer 118, the upper surface 116 of the first nitride layer 115, and the upper surface 126 of the second nitride layer 125 are all exposed in the patterned vias 154a, 154b.

Figure 23:
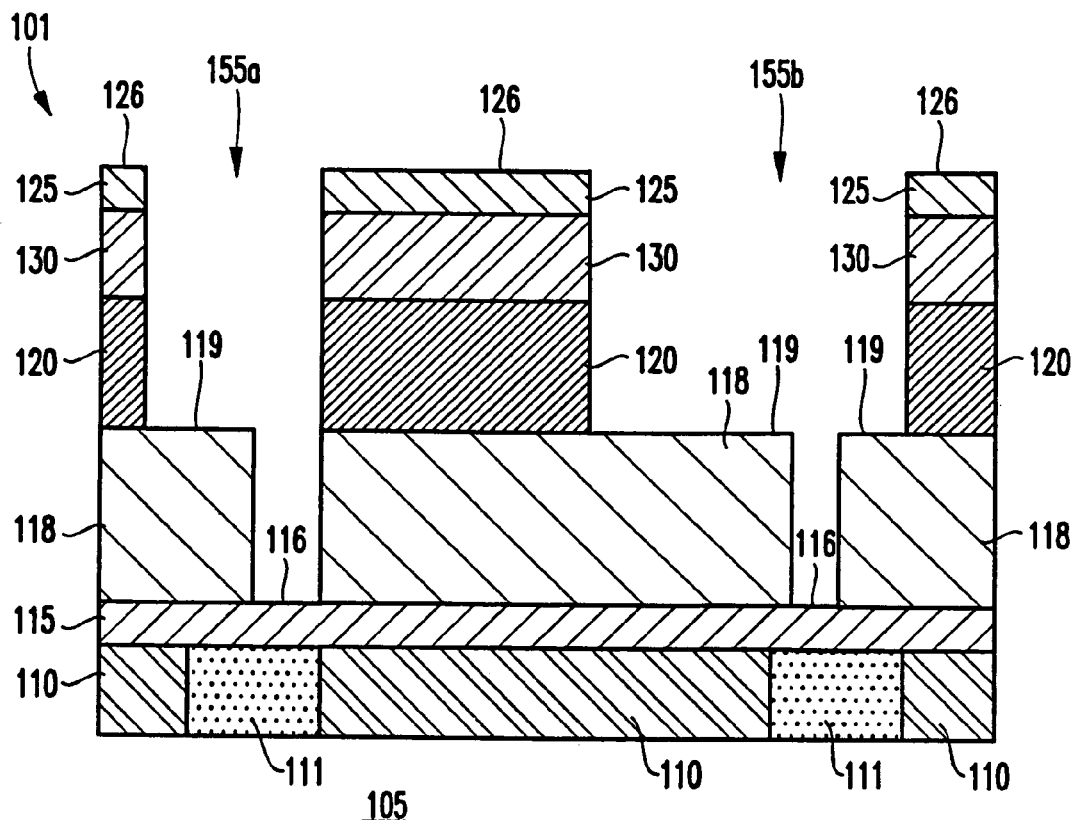
FIG. 23 is a schematic diagram of a second embodiment of a partially completed integrated circuit according to the present invention.
Figure 24:
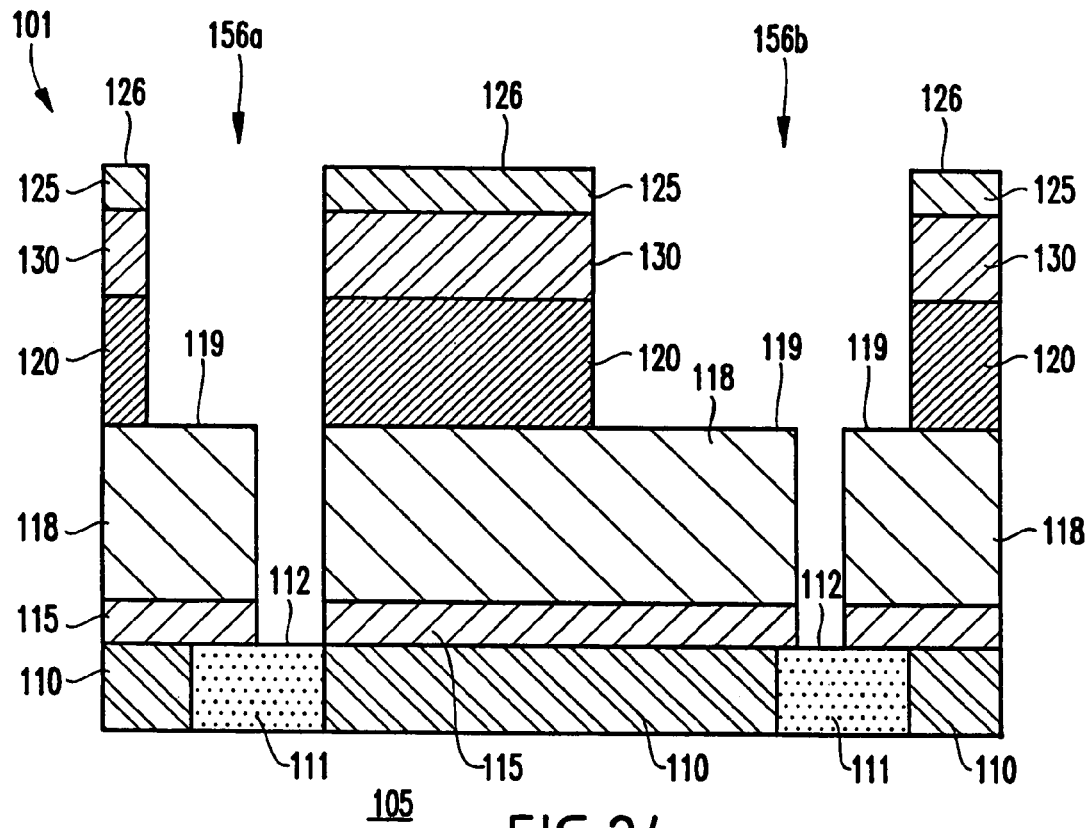
FIG. 24 is a schematic diagram of a second embodiment of a partially completed integrated circuit according to the present invention.

As depicted in FIG. 23, portions of the low-k layer 120 are etched to further expose additional portions 119 of the first oxide layer 118 thereby creating patterned vias 155a, 155b. There is a difference shown in the size between vias 155a and 155b because the difference is meant to show troughs of different sizes and/or dimensions. In fact, on typical semiconductor damascene and dual damascene wafers, lines or troughs are typically of the same depth at any discreet level but may very well have a different x or y dimension. This increases the current-carrying ability of the line formed by the trough. As shown in the figures, a practical example is illustrated with a smaller trough (line or conductor) on the left side and a bigger trough (line or conductor) on the right side. Additionally, the upper surface 116 of the first nitride layer 115 remains exposed. In FIG. 24, the exposed portions 116 of the first nitride layer 115 are etched thereby exposing the upper surface 112 of the wiring conductors 111, and furthermore creating patterned vias 156a, 156b.

Figure 25:
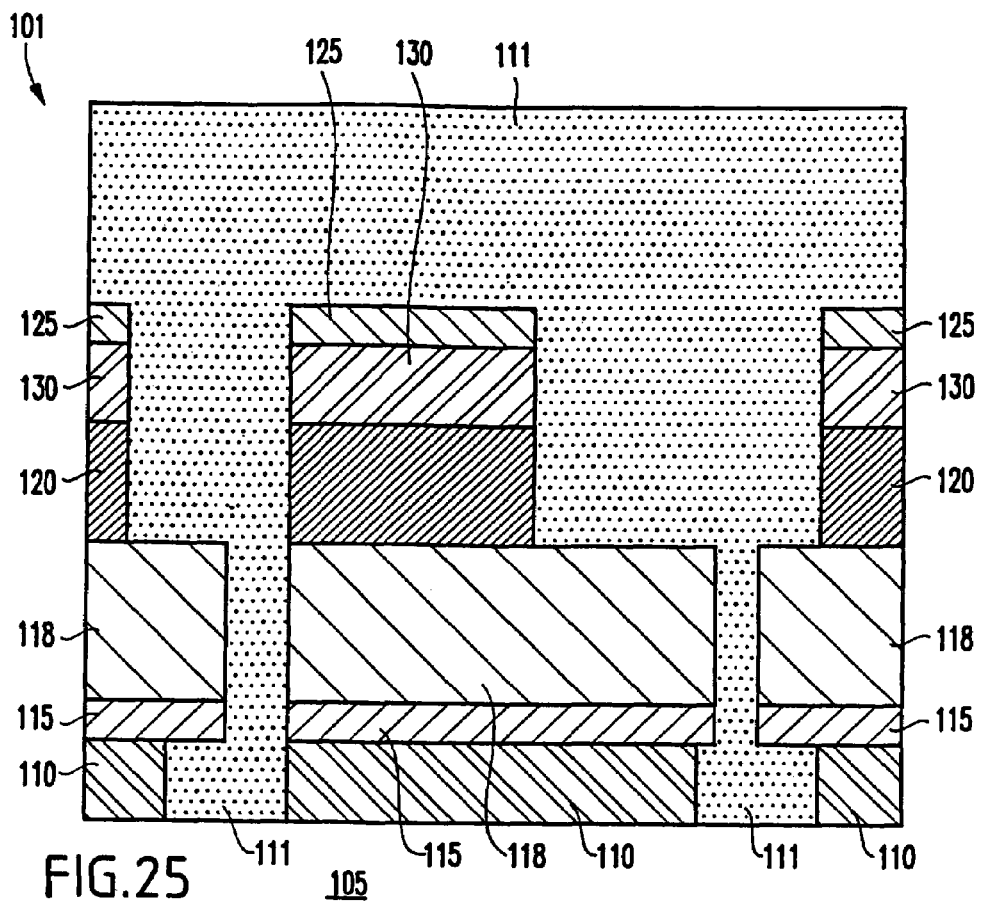
FIG. 25 is a schematic diagram of a second embodiment of a partially completed integrated circuit according to the present invention.

Next, as shown in FIG. 25, the vias 156a, 156b are filled with a metal material, preferably copper, to create conductors 111, which comprises the same material as used to create the wiring conductors 111. Moreover, the metal material is deposited over the entire device 101 to create a temporary conductive cap layer 111. Not shown in FIG. 25 is an intermediate "liner" material that may be deposited prior to the copper fill material. This would preferably be a thin liner on the top surfaces of the "open" structure and into which the copper fill material would be placed. Preferably, the liner is comprised of tantalum, tantalum-nitride, tungsten, and CVD titanium nitride, as well as other suitable materials.

Figure 26:
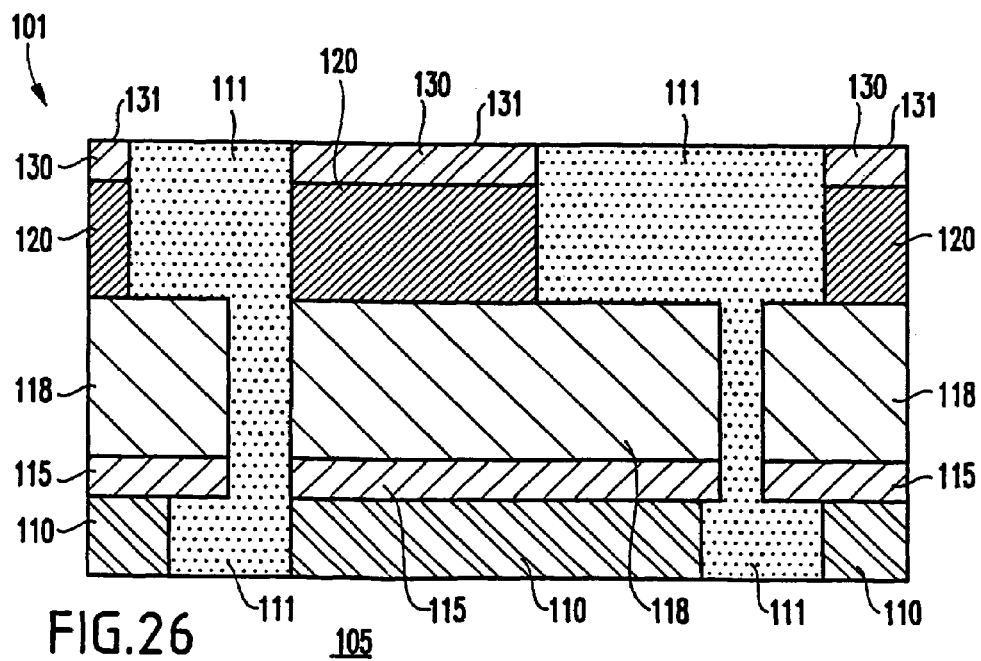
FIG. 26 is a schematic diagram of a second embodiment of a completed integrated circuit according to the present invention.

FIG. 26 illustrates the final step in the process wherein the device 101 is planarized, thus removing the second nitride layer 125 and the portion of the upper temporary conductive cap layer 111 above the second oxide layer 130. The completed planarized device 101 comprises the metallization layer 110 over the substrate 105. The metallization layer 110 comprises wiring conductors 111 therein. Above the metallization layer 110 and wiring conductors 111 is the first nitride insulating barrier layer 115. Above the first nitride layer 115 is the first oxide layer 118 and the layer 120 of low dielectric constant material, such as SILK®, FLARE®, and traditional materials such as silicon dioxide, fluorinated silicon dioxide (FSG), and microporous glasses such as Nanoglass®, as well as Black Diamond, Coral, and Xerogel. Next, above the low-k layer 120 is the second oxide layer 130. The conductors 111 extend through the low-k layer 120 up through the upper surface 126 of the device 101. The differences between the left side and right side vias is the real world definition of an optimal example on the right side and a misaligned example on the left side. The second embodiment is better than conventional normal processing because the addition of the sacrificial tungsten metal helps to control corner rounding, etch undercutting, etc., and thus, aids in the photolithography process window to define the structure and maintain critical dimension (CD) control. Also, the metal acts as a spacer on the vertical sidewalls to negate resputtering of the polyarylene material by the RIE etch into the via bottom and subsequent degradation of the interfacial contact to the previous conductor.

A third embodiment is shown in FIGS. 27 through 31. This embodiment illustrates a structure and method of depositing a dep/etch/dep (deposition/etching/deposition) liner into a PAE via. Furthermore, this embodiment teaches a method which may be used in conjunction with either the first embodiment (shown in FIGS. 1-12) or second embodiment (shown in FIGS. 13-26), or both, according to the present invention.

Figure 27:
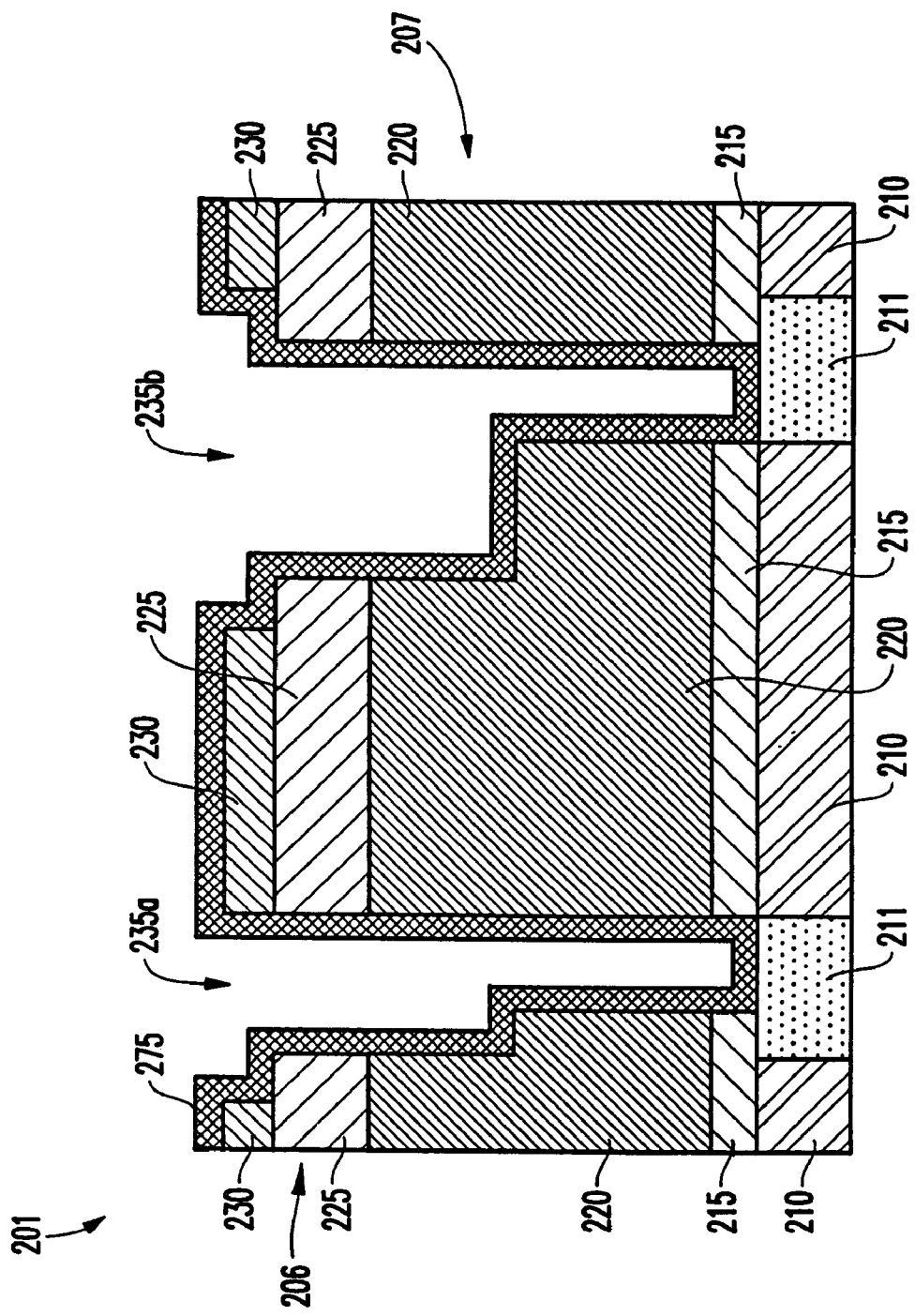
FIG. 27 is a schematic diagram of a third embodiment of a partially completed integrated circuit according to the present invention.

FIG. 27 shows a partially completed integrated circuit device 201 similar to that described in the first embodiment, and more specifically, comprising a plurality of insulator layers 207 stacked on a substrate 205. Next, a metallization layer 210 is deposited over the substrate 205. The metallization layer 210 comprises wiring conductors 211 therein. The wiring conductors are preferably comprised of copper. Above the metallization layer 210 and wiring conductors 211 is a first nitride insulating barrier layer 215. Above the first nitride layer 215 is a layer 220 of low dielectric constant material, such as SiLK®, FLARE®, and traditional materials such as silicon dioxide, fluorinated silicon dioxide (FSG), and microporous glasses such as Nanoglass®, as well as Black Diamond, Coral, and Xerogel. Next, above the low-k layer 220 is a second nitride insulating barrier layer 225. Finally, a cap insulating oxide layer 230 is shown above the second nitride layer 225. The oxide layer 230 and the second nitride layer 225 together comprise a hardmask 206. While the stack 207 in device 201 is designed similarly to the stack 7 in device 1, it is well understood that such a stack 207 could be designed to be similar to the stack 107 in device 101.

FIG. 27 illustrates several processing steps. Here, the device 201 is at the stage of processing after the troughs/vias 235a, 235b have been fully patterned in an insulative stack 207, specifically PAE. That is, after the damascene (either single or dual) process has taken place. Next, the via 235a, 235b bottom is cleaned in order to expose the upper surface 212 (not shown) of the wiring conductor 211 using a standard wet clean such as EKC®, available from EKC Technology, Inc., CA, USA; or DHF (dilute hydrogen fluoride). Next, the wafer is heated in order to degas water or other chemicals absorbed into the PAE 207 or underlying metal surfaces 212. Then, a reactive ion etching or argon sputter cleaning process is optionally performed. After this step, a first thin metal layer 275, such as 5-10 nm of TaN, is deposited over the exposed surfaces of the oxide layer 230, second nitride layer 225, low-k layer 220, and over the wiring conductors 211 in vias 235a, 235b.

Figure 28:
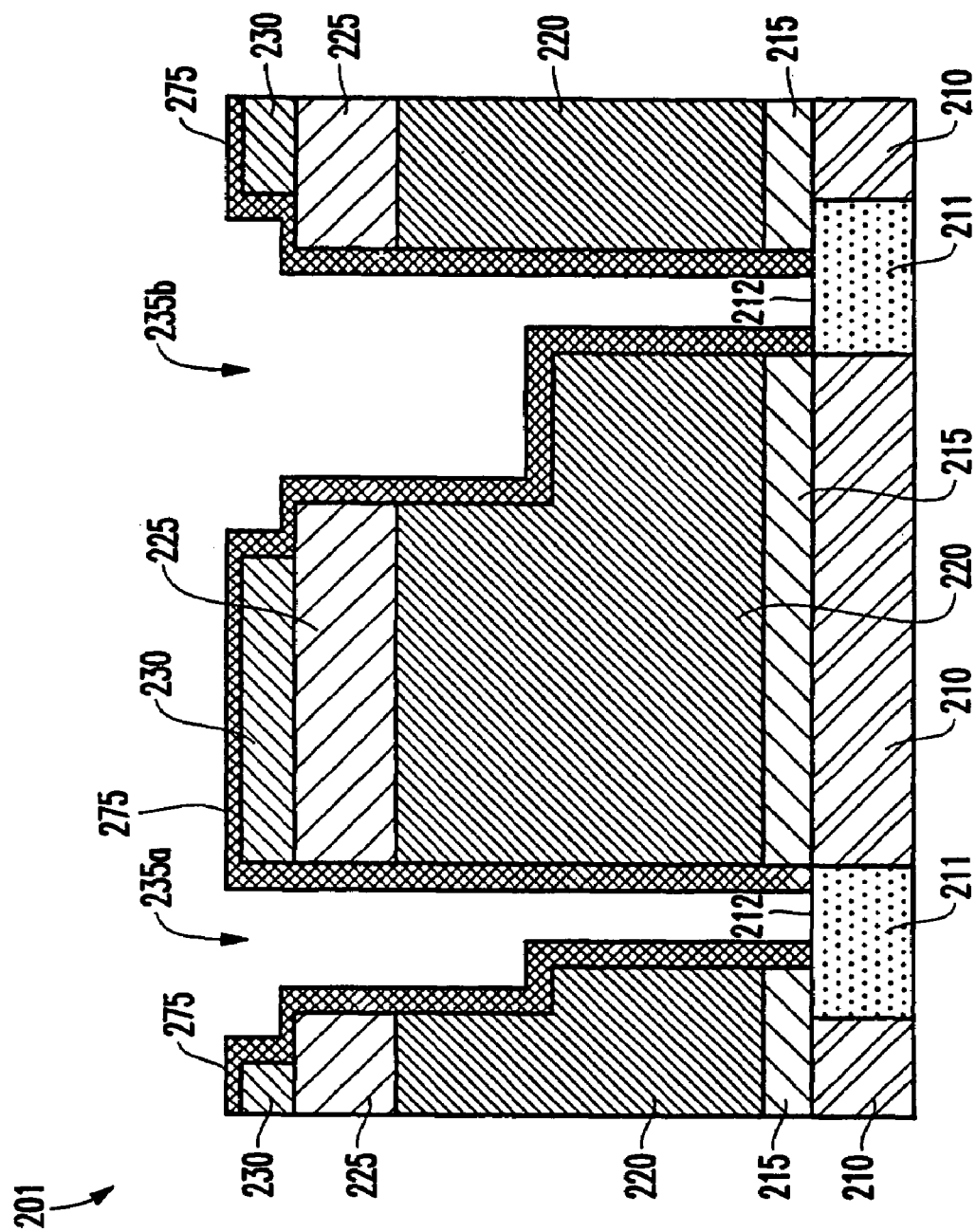
FIG. 28 is a schematic diagram of a third embodiment of a partially completed integrated circuit according to the present invention.
Figure 29:
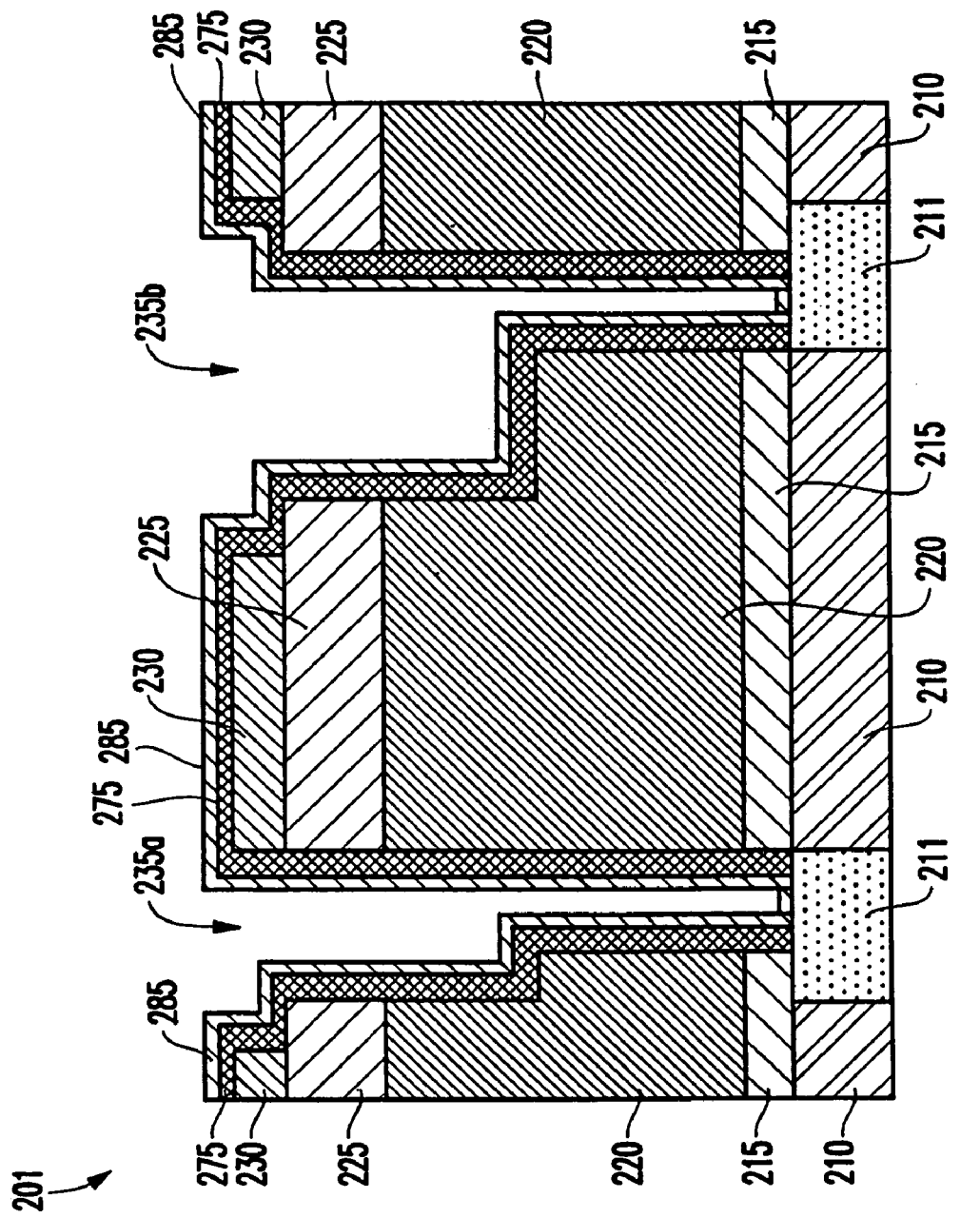
FIG. 29 is a schematic diagram of a third embodiment of a partially completed integrated circuit according to the present invention.
Figure 30:
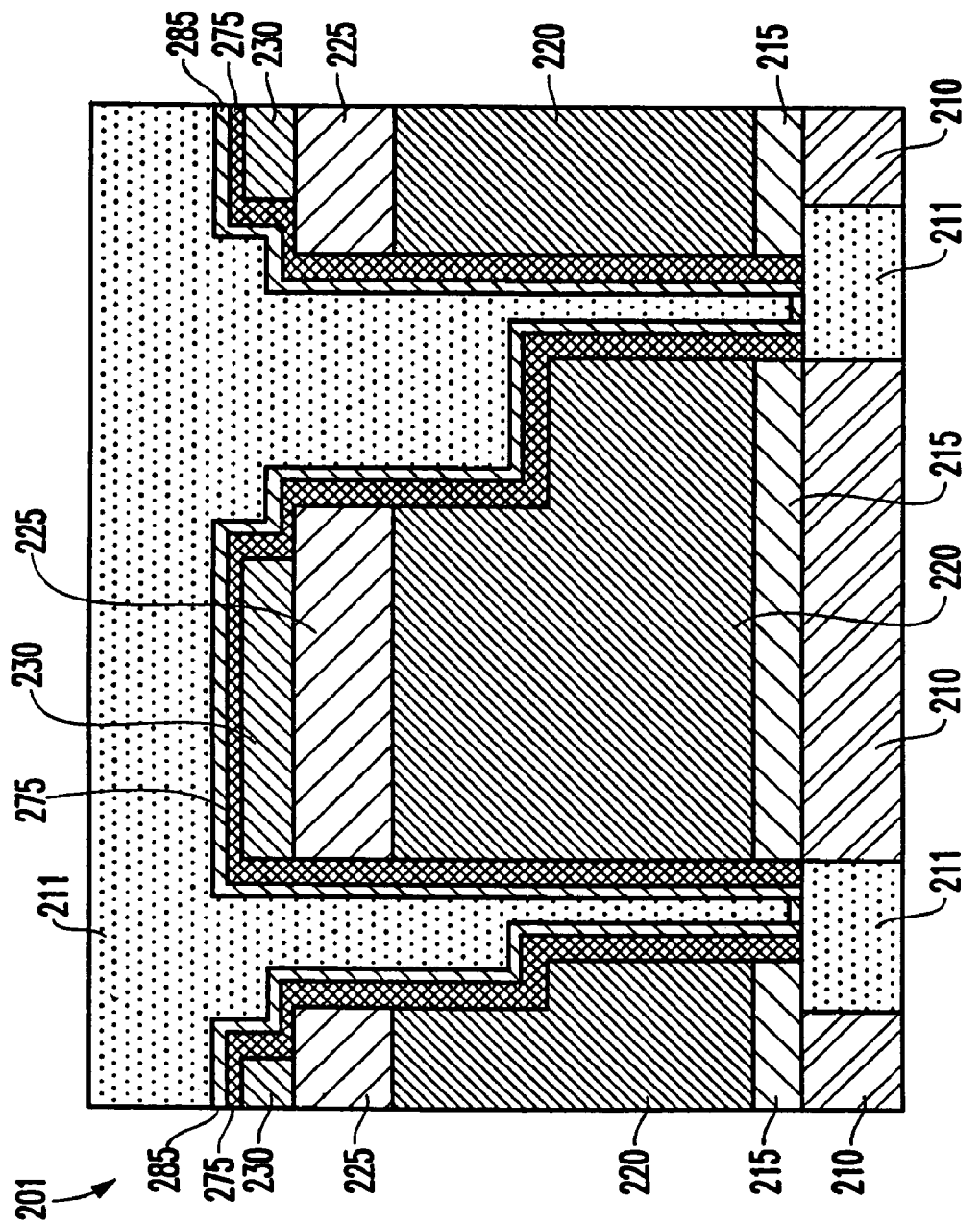
FIG. 30 is a schematic diagram of a third embodiment of a partially completed integrated circuit according to the present invention.

In FIG. 28, the wafer is exposed to a reactive ion etching or an argon sputter cleaning process in order to remove the thin metal layer 275 from the via 235a, 235b bottom, thereby exposing the surface 212 of the wiring conductor 211. Moreover, the underlying metal surface 212 at the via bottom is also sputter cleaned. It is also seen in FIG. 28 that all horizontal surfaces of the thin metal layer 275 are thinner than the vertical surfaces of the thin metal layer 275 in the device 201 due to the sputter etchback process. Upon completion of this step, and illustrated in FIG. 29, a second thin metal layer 285 is deposited by chemical vapor deposition over the first thin metal layer 275, and in the via 235a, 235b bottoms over the exposed surfaces 212 of the wiring conductors 211. The second thin metal layer 285 may comprise TiN+TaN+Ta, or TiN+Ta, or TaN/Ta, or Ta, etc., all films are preferably PVD/IPVD, although CVD deposition modes of any of the above are also possible. Next, as depicted in FIG. 30 a copper seed/plated copper liner 211 is deposited using a chemical-mechanical process to damascene the metal 211 into the troughs/vias 235a, 235b. Thus, the troughs/vias 235a, 235b are filled with a metal material, preferably copper, to create conductors 211, which comprises the same material as used to create the wiring conductors 211. As seen, the metal material is deposited over the entire device 201 to create a temporary conductive cap layer 211.

Figure 31:
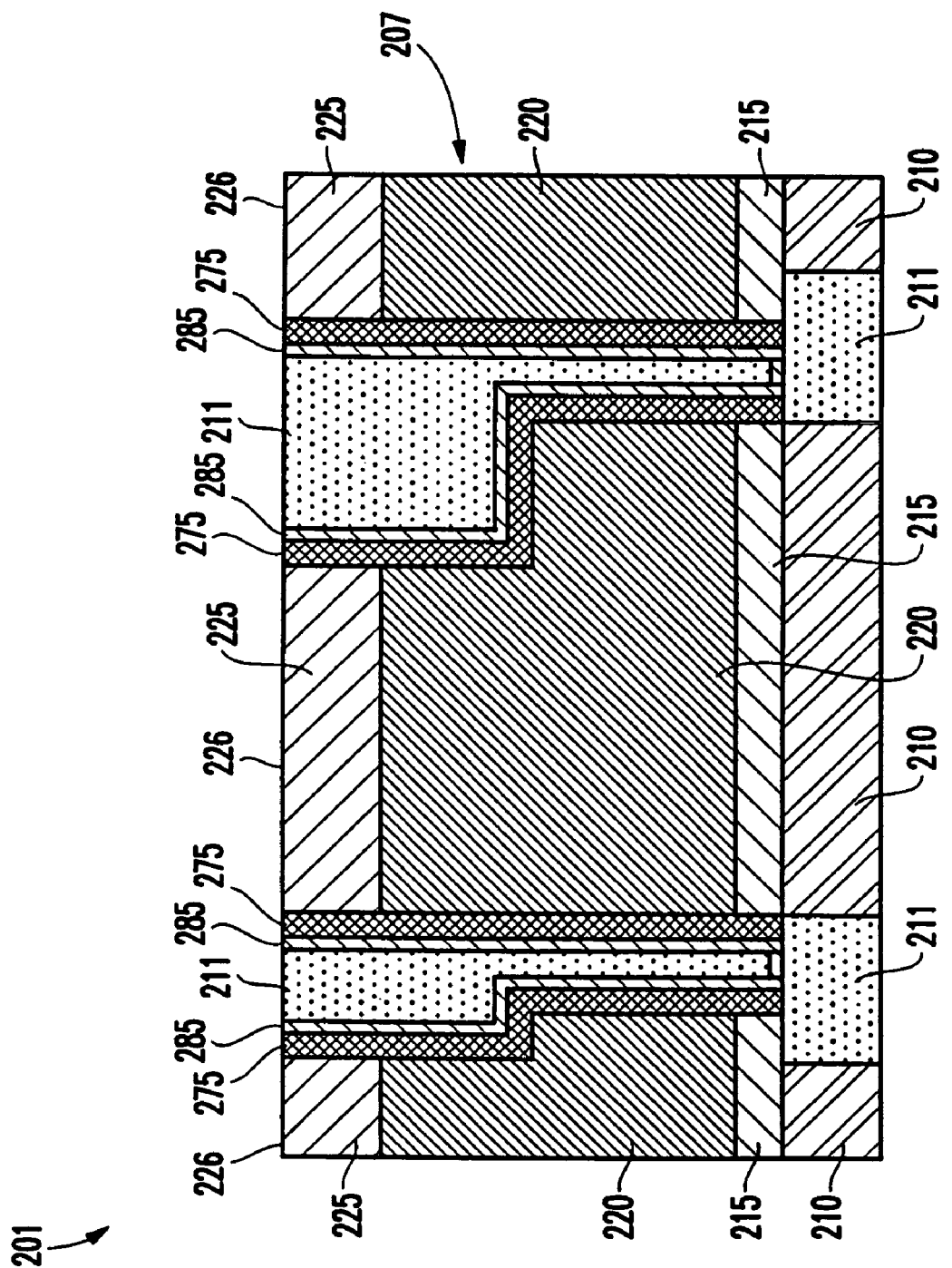
FIG. 31 is a schematic diagram of a third embodiment of a completed integrated circuit according to the present invention.

FIG. 31 illustrates the final step in the process wherein the device 201 is planarized, thus removing the oxide layer 230 and the portion of the upper temporary conductive cap layer 211 above the second nitride layer 225. The completed planarized device 201 comprises the metallization layer 210 over the substrate 205. The metallization layer 210 comprises wiring conductors 211 therein. Above the metallization layer 210 and wiring conductors 211 is the first nitride insulating barrier layer 215. Above the first nitride layer 215 is the layer 220 of low dielectric constant material, such as SiLK®, FLARE®, and traditional materials such as silicon dioxide, fluorinated silicon dioxide (FSG), and microporous glasses such as Nanoglass®, as well as Black Diamond, Coral, and Xerogel. Next, above the low-k layer 220 is the second nitride insulating barrier layer 225. The conductors 211 in this embodiment do not extend through the low-k layer 220 up through the upper surface 226 of the device 201. Rather, the second thin metal layer 285 separates the lower wiring conductors 211 in the metallization layer 210 from the upper conductors 211 in the insulative stack 207. Moreover, the second thin metal layer 285 is separated from the insulative stack 207 by the first thin metal layer 275.

The structure shown in FIG. 31 is better than conventional structures because the initial deposition of metal liner 285 (such as tantalum, tantalum-nitride, CVD titanium-Nitride, etc.,) acts to protect the sidewalls of the structure as the via bottom is penetrated by the argon sputter etch process. Therefore, corner rounding, resputtering of the polyarylene sidewall material down to the via bottom, etc., is negated because any resputtering is of metallic material which is not detrimental to the via bottom interface. Thus, a more robust via interface is created while dimensionality is maintained.

Figure 32:
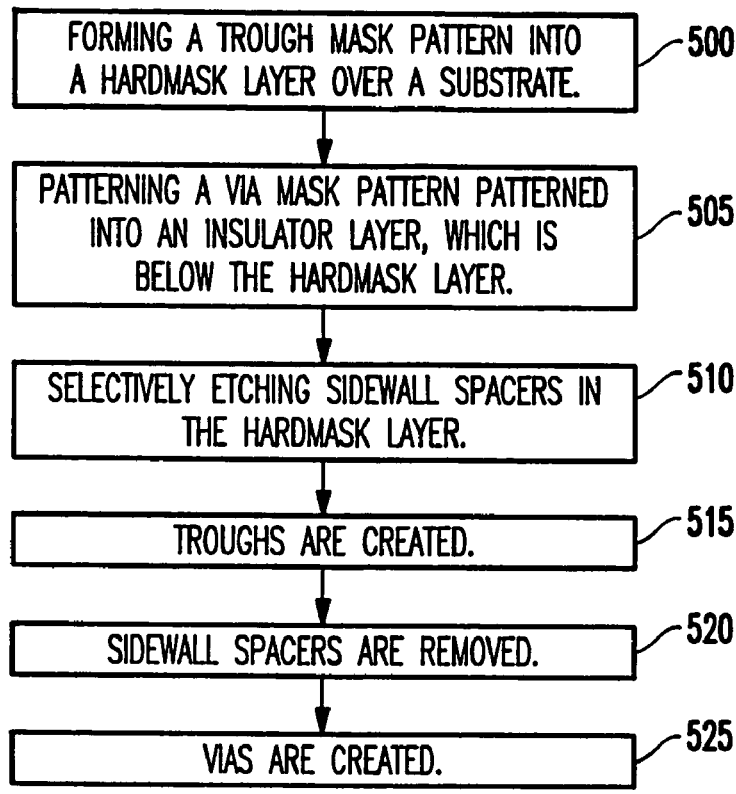
FIG. 32 is a flow diagram illustrating a preferred method of the invention.

FIG. 32 illustrates a flow diagram of the entire process of forming a dual damascene interconnect structure 1, 101 in a semiconductor substrate 5, 105. The method comprises first forming 500 a trough mask pattern 35b, 135b into a hardmask layer 6, 106 over a substrate 5, 105. Next, a via mask pattern 47b, 147b is patterned 505 into an insulator layer 7, 107, wherein the insulator layer 7, 107 is below the hardmask layer 6, 106. Then, sidewall spacers 41, 141 are selectively etched 510 in the hardmask layer 6, 106. Upon completion of this step, troughs 35b, 135b are created 515 and are defined by the trough mask pattern 35b, 135b. Next, the sidewall spacers 41, 141 are removed 520. Finally, vias 47b, 147b are created 525 and are defined by the via mask pattern 47b, 147b.

Figure 33:
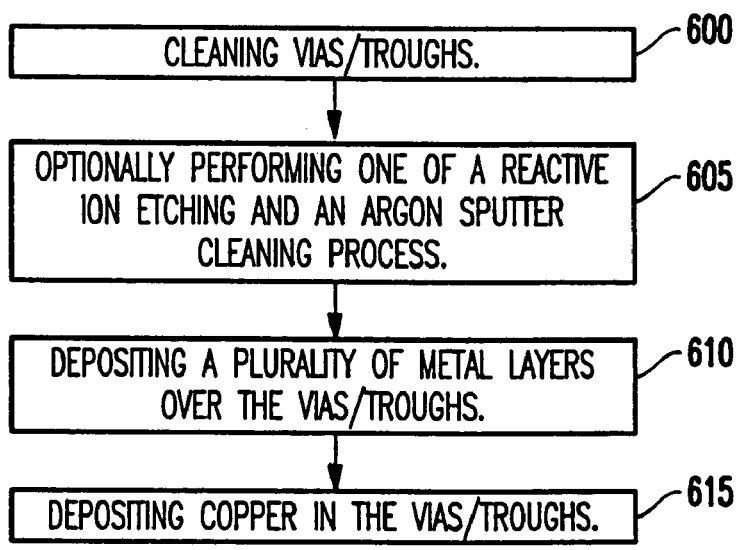
FIG. 33 is a flow diagram illustrating a preferred method of the invention.

FIG. 33 illustrates a flow diagram of the third embodiment of the present invention, which describes depositing a liner 275, 285 into the vias 235b of the dual damascene interconnect device 201. First, the vias/troughs 235b of the integrated circuit device 201 are cleaned 600. The next step involves optionally performing 605 one of a reactive ion etching and an argon sputter cleaning process. Then, a plurality of metal layers 275, 285 are deposited 610 over the vias/troughs 235b. Finally, copper is deposited 615 in the vias/troughs 235b.

There are several benefits of the present invention. For example, the present invention provides a novel structure and method for forming a sacrificial metal spacer dual damascene structure as well as a single damascene structure. Also, the present invention provides a new and improved technique of dual damascene and single damascene processing which overcomes the limitations of the conventional designs. Additionally, the present invention improves the dual damascene process window. Furthermore, the present invention eliminates the problem of PAE sputtering into the via bottom by using a deep etch process. Finally, the present invention uses metal (tungsten) spacers to aid in fabricating damascene wires/vias.

The structure and methods of the present invention are better than conventional normal processing because the addition of the sacrificial tungsten metal helps to control corner rounding, etch undercutting, etc., either when located at the very top (as in the first embodiment) or subsequently (as in the second and third embodiments), and thus helps the photolithography process window to define the structure and maintain critical dimension (CD) control. In addition, the metal can also act as a spacer on the vertical sidewalls to negate resputtering of the polyarylene material by the RIE etch (or liner/seed sputter process as in the third embodiment) into the via bottom and subsequent degradation of the interfacial contact to the previous conductor.

While the invention has been described in terms of preferred embodiments, those skilled in the art will recognize that the invention can be practiced with modification within the spirit and scope of the appended claims.

What is claimed is:

1. A method of forming a dual damascene interconnect structure in a semiconductor substrate, said method comprising:
    forming a trough mask pattern into a hardmask over a substrate, wherein said hardmask comprises a first layer below a second layer;
    patterning a via mask pattern into an insulator layer, wherein said insulator layer is between said substrate and said hardmask;
    selectively forming sidewall spacers, wherein said sidewall spacers are only on said first layer of said hardmask and on sidewalls of said second layer of said hardmask, and wherein said spacers comprise a harder material when compared to said hardmask;
    creating troughs defined by said trough mask pattern in said insulator layer;
    removing said sidewall spacers; and
    creating vias in said substrate defined by said via mask pattern.

2. The method of claim 1, wherein said insulator layer is formed to include oxide.

3. The method of claim 1, wherein said insulator layer is formed to include a dielectric layer further comprising polyarylene.

4. The method of claim 1, wherein said sidewall spacers are formed to include tungsten.

5. The method of claim 1, further comprising depositing a liner into said vias.

6. The method of claim 5, wherein said depositing comprises:
    cleaning said mask patterns;
    performing one of a reactive ion etching and an argon sputter cleaning;
    depositing a plurality of metal layers over said mask patterns; and
    depositing copper in said mask patterns.

7. The method of claim 5, wherein said depositing prevents said insulator layer from sputtering into said via.

8. The method of claim 5, further comprising depositing conductive material over said liner.

9. A method of forming a dual damascene interconnect structure in a semiconductor substrate, said method comprising:
    forming a trough mask pattern into a hardmask over a substrate, wherein said hardmask comprises a first layer below a second layer;
    patterning a via mask pattern into an insulator layer, wherein said insulator layer is between said substrate and said hardmask;
    selectively forming conductive sidewall spacers, wherein said sidewall spacers are only on said first layer of said hardmask and on sidewalls of said second layer of said hardmask, and wherein said spacers comprise a harder material when compared to said hardmask;

creating troughs defined by said trough mask pattern in said insulator layer;

removing said conductive sidewall spacers; and creating vias in said substrate defined by said via mask pattern.

10. The method of claim 9, wherein said insulator layer is formed to include oxide.

11. The method of claim 9, wherein said insulator layer is formed to include a dielectric layer further comprising polyarylene.

12. The method of claim 9, wherein said conductive sidewall spacers are formed to include tungsten.

13. The method of claim 9, further comprising depositing a liner into said vias.

14. The method of claim 13, wherein said depositing comprises:

cleaning said mask patterns;

performing one of a reactive ion etching and an argon sputter cleaning;

depositing a plurality of metal layers over said mask patterns; and depositing copper in said mask patterns.

15. The method of claim 13, wherein said depositing prevents said insulator layer from sputtering into said via.

16. A method of forming a dual damascene interconnect structure in a semiconductor substrate, said method comprising:

forming a trough mask pattern into a hardmask over a substrate, wherein said hardmask comprises a first layer below a second layer;

patterning a via mask pattern into an insulator layer, wherein said insulator layer is between said substrate and said hardmask;

selectively forming conductive sidewall spacers, wherein said sidewall spacers are only on said first layer of said hardmask and on sidewalls of said second layer of said hardmask, and wherein said spacers comprise a harder material when compared to said hardmask;

creating troughs defined by said trough mask pattern into said insulator layer in said insulator layer;

removing said conductive sidewall spacers; and creating vias in said substrate defined by said via mask pattern into said insulator layer.

17. The method of claim 16, wherein said insulator layer is formed to include oxide.

18. The method of claim 16, wherein said insulator layer is formed to include a dielectric layer further comprising polyarylene.

19. The method of claim 16, wherein said conductive sidewall spacers are formed to include tungsten.

20. The method of claim 16, further comprising depositing a liner into said vias.

* * * * *